United States Patent
Xie et al.

(10) Patent No.: US 9,515,163 B2
(45) Date of Patent: Dec. 6, 2016

(54) METHODS OF FORMING FINFET SEMICONDUCTOR DEVICES WITH SELF-ALIGNED CONTACT ELEMENTS USING A REPLACEMENT GATE PROCESS AND THE RESULTING DEVICES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Shom Ponoth, Gaithersburg, MD (US); Balasubramanian Pranatharthiharan, Watervliet, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 32 days.

(21) Appl. No.: 14/021,594

(22) Filed: Sep. 9, 2013

(65) Prior Publication Data

US 2015/0069532 A1 Mar. 12, 2015

(51) Int. Cl.
*H01L 29/66* (2006.01)
*H01L 29/78* (2006.01)
*H01L 29/417* (2006.01)

(52) U.S. Cl.
CPC ... *H01L 29/66545* (2013.01); *H01L 29/41791* (2013.01); *H01L 29/66795* (2013.01); *H01L 29/785* (2013.01)

(58) Field of Classification Search
CPC .................. H01L 29/66545; H01L 29/66795; H01L 27/0886; H01L 29/785; H01L 29/66553; H01L 29/7854; H01L 29/7833; H01L 29/6659; H01L 21/283; H01L 21/76832; H01L 21/76816; Y10S 977/938
USPC .......... 257/346, 401, E29.255, E21.428, 77, 257/192, 759, 734, 774; 438/151, 303, 124, 438/283

See application file for complete search history.

(56) References Cited

U.S. PATENT DOCUMENTS

| | | | | |
|---|---|---|---|---|
| 2006/0220141 A1* | 10/2006 | Besser | ............. | H01L 21/28518 257/371 |
| 2008/0067613 A1* | 3/2008 | Anderson | ......... | H01L 29/41791 257/401 |
| 2008/0315309 A1* | 12/2008 | Chang et al. | ................. | 257/346 |
| 2009/0020819 A1* | 1/2009 | Anderson | ......... | H01L 29/41791 257/365 |
| 2011/0092069 A1* | 4/2011 | Cheng | ............... | H01L 21/76808 438/672 |
| 2011/0272767 A1* | 11/2011 | Yin et al. | ....................... | 257/412 |
| 2012/0018739 A1* | 1/2012 | Liang et al. | .................... | 257/77 |
| 2012/0261829 A1* | 10/2012 | Lin | ................... | H01L 21/76814 257/774 |
| 2013/0200468 A1* | 8/2013 | Cai | ................... | H01L 29/66545 257/401 |

* cited by examiner

*Primary Examiner* — David Vu
*Assistant Examiner* — Mouloucoulaye Inoussa
(74) *Attorney, Agent, or Firm* — Amerson Law Firm, PLLC

(57) ABSTRACT

One method disclosed herein includes removing a sacrificial gate structure and forming a replacement gate structure in its place, after forming the replacement gate structure, forming a metal silicide layer on an entire upper surface area of each of a plurality of source/drain regions and, with the replacement gate structure in position, forming at least one source/drain contact structure for each of the plurality of source/drain regions, wherein the at least one source/drain contact structure is conductively coupled to a portion of the metal silicide layer and a dimension of the at least one source/drain contact structure in a gate width direction of the transistor is less than a dimension of the source/drain region in the gate width direction.

8 Claims, 22 Drawing Sheets

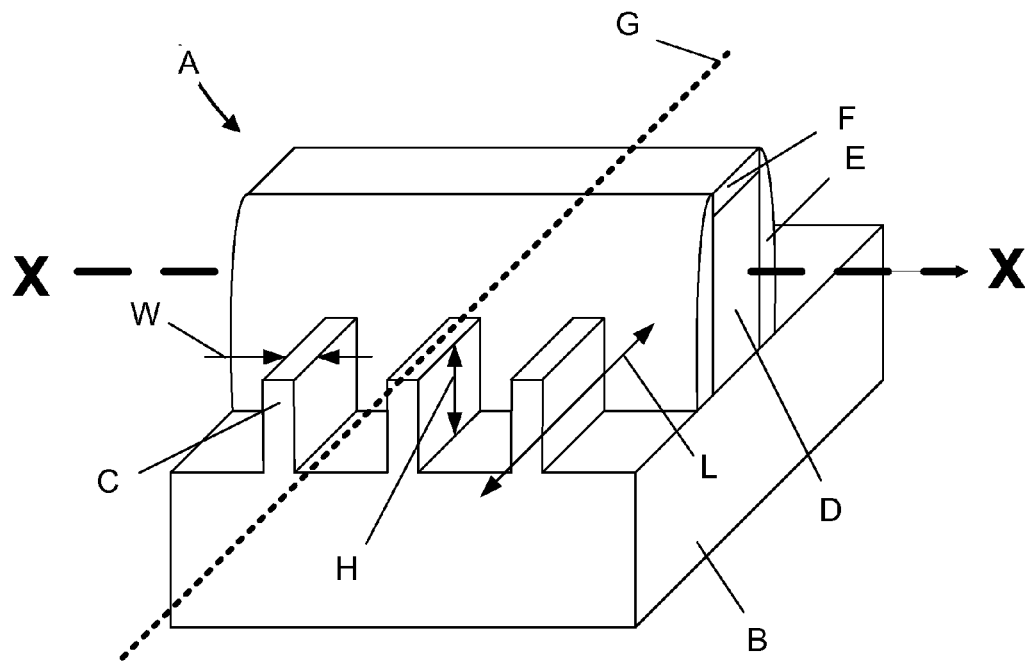
Figure 1A (Prior Art)
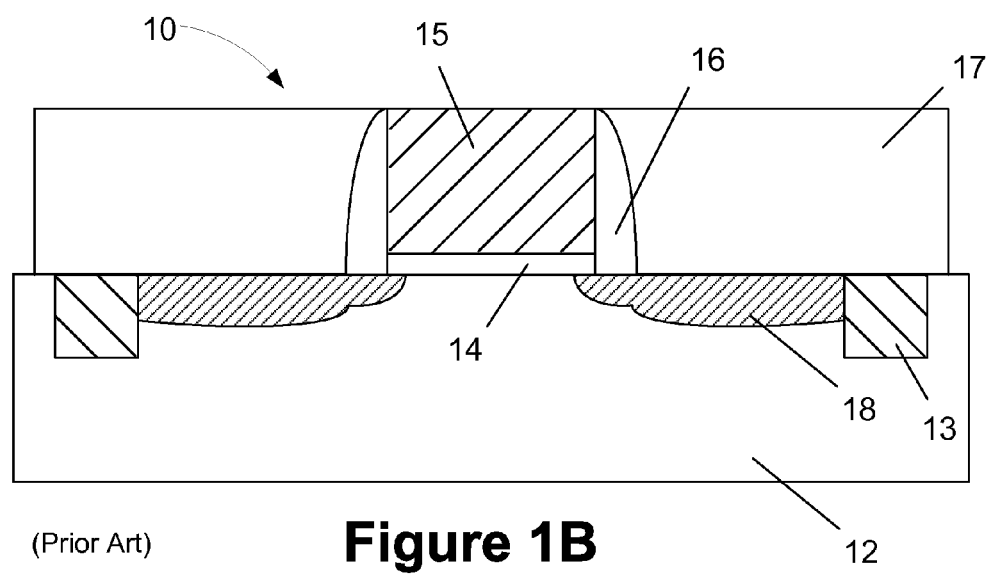
(Prior Art) Figure 1B

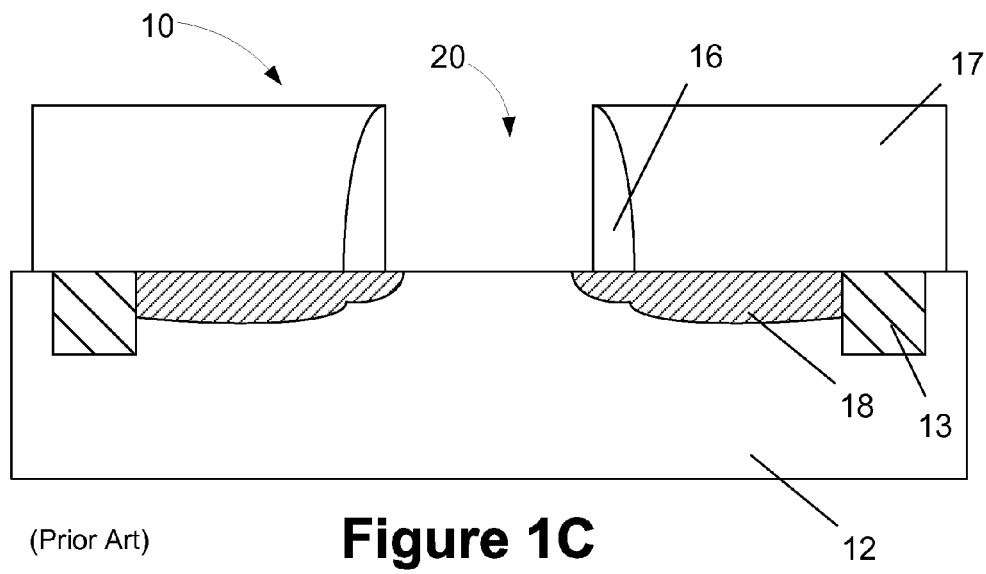
(Prior Art) Figure 1C
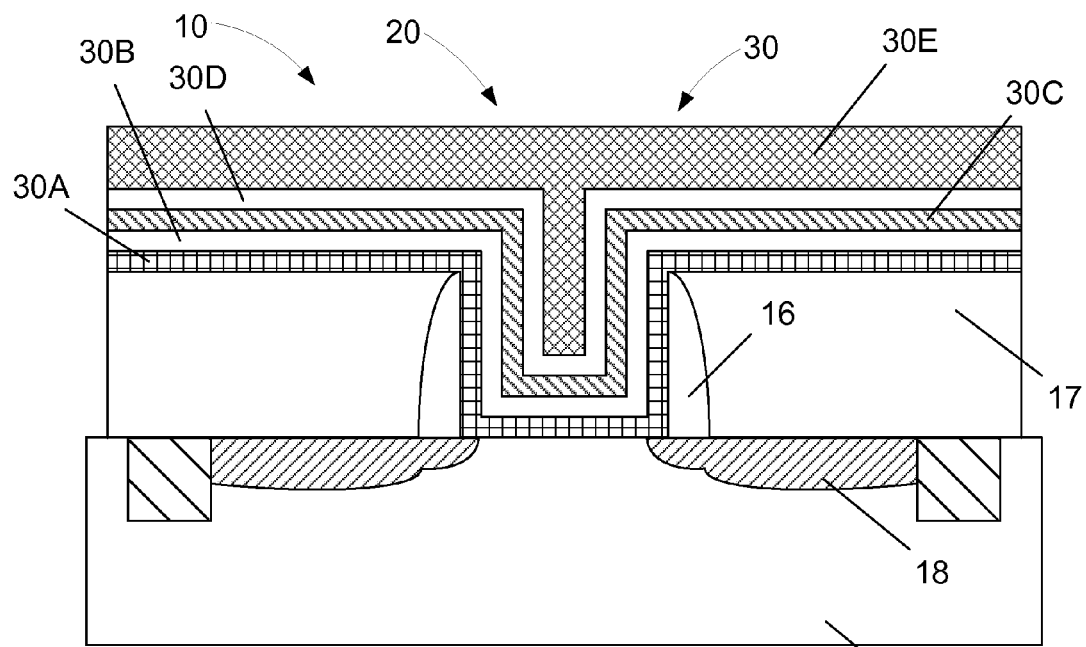
(Prior Art) Figure 1D

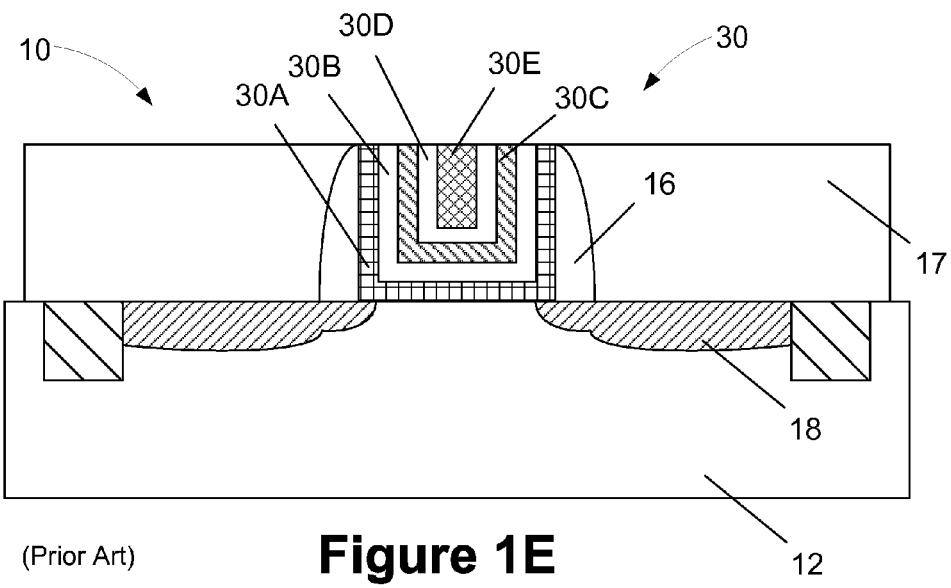
(Prior Art) Figure 1E
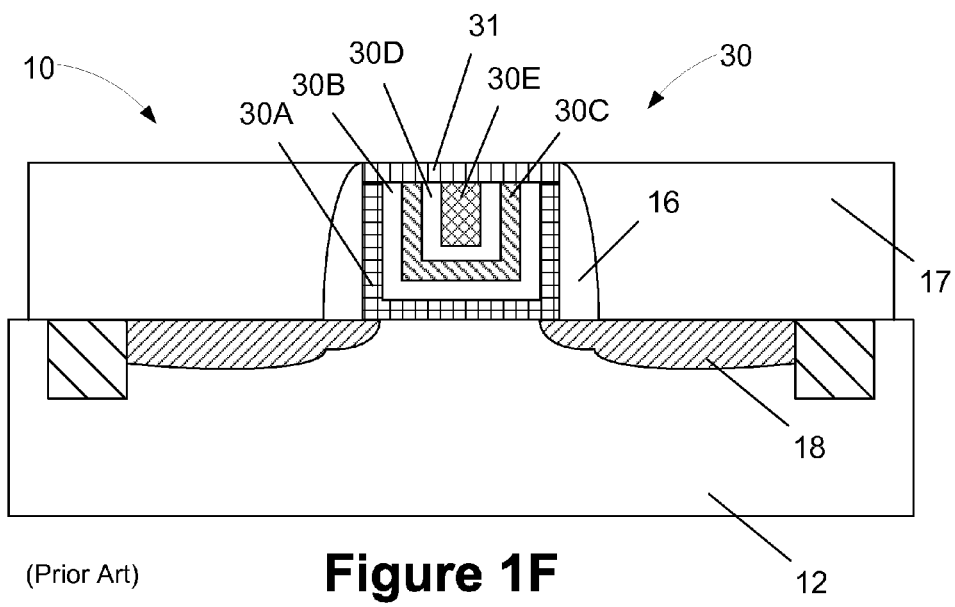
(Prior Art) Figure 1F

View X-X

View Y-Y

View Z-Z

View X-X

View Y-Y

View X-X

View Y-Y

View X-X

View Y-Y

View X-X

View Y-Y

View Z-Z

View X-X

View Y-Y

View X-X

View Y-Y

View X-X

View Y-Y

View X-X

View Y-Y

View X-X

View Y-Y

View X-X

View Y-Y

View X-X

View Y-Y

View X-X

View Y-Y

View X-X

View Y-Y

View X-X

View Y-Y

View X-X

View Y-Y ized devices. The gate structure may also be manufactured above a semiconducting substrate that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating

METHODS OF FORMING FINFET SEMICONDUCTOR DEVICES WITH SELF-ALIGNED CONTACT ELEMENTS USING A REPLACEMENT GATE PROCESS AND THE RESULTING DEVICES

BACKGROUND OF THE INVENTION

1. Field of the Invention

The present disclosure generally relates to the fabrication of integrated circuits, and, more particularly, to various methods of forming self-aligned contacts for a FinFET semiconductor device that is manufactured using a replacement gate process, and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source drain regions. Even if an epi "merger" process is not performed, an epi growth process will typically be performed on the fins C to increase their physical size.

In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1D, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

Over recent years, due to the reduced dimensions of the transistor devices, the operating speed of the circuit components has been increased with every new device generation and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of the materials that protect the conductive gate electrode, i.e., the gate cap layer and the sidewall spacers, as will be explained with reference to FIGS. 2A-2B. FIG. 2A schematically illustrates a cross-sectional view of an integrated circuit product 40 at an advanced manufacturing stage. As illustrated, the product 40 comprises a plurality of illustrative gate structures 41 that are formed above a substrate 42, such as a silicon substrate. The gate structures 41 are comprised of an illustrative gate insulation layer 43 and an illustrative gate electrode 44. An illustrative gate cap layer 46 and sidewall spacers 48 encapsulate and protect the gate structures 41. The gate cap layer 46 and the sidewall spacers 48 are typically made of silicon nitride. Also depicted in FIG. 2A are a plurality of raised source/drain regions 50 and a layer of insulating material 52, e.g., silicon dioxide. FIG. 2B depicts the product 40 after a contact opening 54 has been formed in the layer of insulating material 52 for a self-aligned contact. Although the contact etch process performed to form the opening 54 is primarily directed at removing the desired portions of the layer of insulating material 52, portions of the protective gate cap layer 46 and the protective sidewall spacers 48 get consumed during the contact etch process, as simplistically depicted in the dashed regions 56. Accordingly, after the desired portions of the layer of insulating material 52 are removed, a so-called "punch-through" etching process is performed to remove the portions of an optional etch stop layer (not shown) positioned above the source/drain regions 50 and thereby expose the source/drain regions 50 such that a conductive contact structure may be formed to establish electrical connection to the source/drain regions 50. Given that the cap layer 46 and the spacers 48 are attacked in the contact etch process, the thickness of these protective materials must be sufficient such that, even after the contact etch process is completed, there remains sufficient cap layer material and spacer material to protect the gate structures 41. Accordingly, device manufacturers tend to make the cap layers 46 and spacers 48 "extra thick," i.e., with an additional thickness that may otherwise not be required but for the consumption of the cap layers 46 and the spacers 48 during the contact etch process. In turn, increasing the thickness of such structures, i.e., increasing the thickness of the gate cap layers 46, causes other problems, such as increasing the aspect ratio of the contact opening 54 due to the increased height, increasing the initial gate height, which makes the gate etching and spacer etching processes more difficult, etc.

FIG. 3 is a simplistic plan view of an illustrative prior art FinFET device 60 that will be referenced to discuss one particular problem as it relates to the formation of contact structures on a FinFET device. In general, the FinFET device 60 is formed above an active region 61 that is defined in a semiconductor substrate. In the depicted example, the FinFET device 60 is comprised of three illustrative fins 62 and an illustrative gate structure 63. A sidewall spacer 63A and a gate cap layer 63B may be formed so as to encapsulate the gate structure 63. The fins 62 may be either merged on unmerged. In the depicted example, the fins 62 are unmerged. The fins 62 constitute the source/drain (S/D) regions of the device 60. Also depicted are illustrative source/drain contact structures 64 (which are sometimes referred to as "trench silicide" or "TS" or "CA" structures) and a gate contact structure 65 (which is sometimes referred to as a "CB" structure). The source/drain contact structures 64 are formed as a line-type structure to insure, to the extent possible, good contact is achieved with all of the exterior surfaces of all of the fins 62, even when assuming a "worst-case" misalignment scenario. The line-type source/drain contact structures 64 extend across the entire width 69 of the active region 61 in the gate-width direction 69 of the device 60. The space 66 between the gate contact structure 65 and the source/drain contact structures 64 must be large enough such that a short circuit cannot form between the gate contact structure 65 and one of the line-type source/drain contact structures 64. In current day devices, the distance 66 may be very small, and accordingly, the distance 67 between the active region 61 and the gate contact structure 65 may be set to be about 30-60 nm. One way to insure that such a short circuit is not created would be simply increase the distance 67, i.e., position the gate contact structure 65 farther away from the ends of line-type source/drain contact structures 64. Unfortunately, given the drive to ever increase packing densities, such a solution would undesirably increase the "foot-print" of the device 60, thereby resulting in an undesirable area consumption penalty.

The present disclosure is directed to various methods of forming self-aligned contacts for a FinFET semiconductor device that is manufactured using a replacement gate process, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contacts for a FinFET semiconductor device that is manufactured using a replacement gate process, and the resulting semiconductor devices. One method disclosed includes, among other things, forming a sacrificial gate structure above a plurality of fins of a FinFET device, forming a sidewall spacer adjacent the sacrificial gate structure, performing an epitaxial deposition fin-merger process to form a plurality of merged-fin regions that define a plurality of source/drain regions for the transistor, removing the sacrificial gate structure and forming a replacement gate structure in its place, at some point after forming the replacement gate structure, forming a metal silicide layer on an entire upper surface area of each of the plurality of source/drain regions and, with the replacement gate structure in position, forming at least one source/drain contact structure for each of the source/drain regions, wherein the at least one source/drain contact structure is formed such that it is conductively coupled to a portion of the metal silicide layer and a dimension of the at least one source/drain contact structure in a gate width direction of the transistor is less than a dimension of the source/drain region in the gate width direction.

Another illustrative method disclosed herein includes, among other things, forming a sacrificial gate structure above a plurality of fins of a FinFET device, forming a sidewall spacer adjacent the sacrificial gate structure, performing an epitaxial deposition fin-merger process to form a plurality of merged-fin regions that define a plurality of source/drain regions for the transistor, removing the sacrificial gate structure and forming a replacement gate structure in its place, at some point after forming the replacement gate structure, forming a metal silicide layer on an entire upper surface area of each of the source/drain regions, forming a plurality of source/drain contact openings in a layer of insulating material, wherein the source/drain contact openings expose portions of the metal silicide layer, forming at least one gate contact opening in the layer of insulting material, wherein the at least one gate contact opening exposes a portion of the replacement gate structure, and performing a plurality of common process operations to form at least one source/drain contact structure in each of the source/drain contact openings and a gate contact structure in the gate contact opening at the same time, wherein the at least one source/drain contact structure is formed such that it is conductively coupled to a portion of the metal silicide layer and a dimension of the at least one source/drain contact structure in a gate width direction of the transistor is less than a dimension of the source/drain region in the gate width direction.

One illustrative device disclosed herein includes, among other things, a replacement gate structure positioned above a plurality of fins of a FinFET device, sidewall spacers positioned adjacent the replacement gate structure, a plurality of source/drain regions comprised of a merged-fin region, a metal silicide layer positioned on an entire upper surface of the merged-fin region of each of the source/drain regions, a first layer of insulating material formed above the metal silicide layer and at least one source/drain contact structure for each of the plurality of source/drain regions, wherein the at least one source/drain contact structure is conductively coupled to a portion of the metal silicide layer and a dimension of the at least one source/drain contact structure in a gate width direction of the transistor is less than a dimension of the source/drain region in the gate width direction.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of the transistors using a so-called "replacement gate" technique;

Figure 2A:
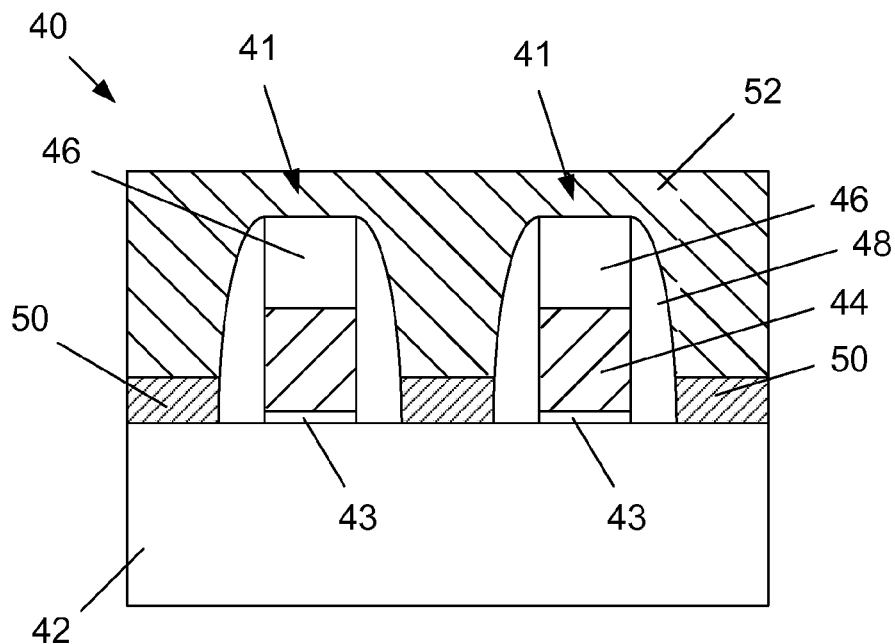
FIGS. 2A-2B schematically illustrate a cross-sectional view of an illustrative prior art integrated circuit product that employs self-aligned contacts.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contacts for a FinFET semiconductor device that is manufactured using a replacement gate process, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 4A:
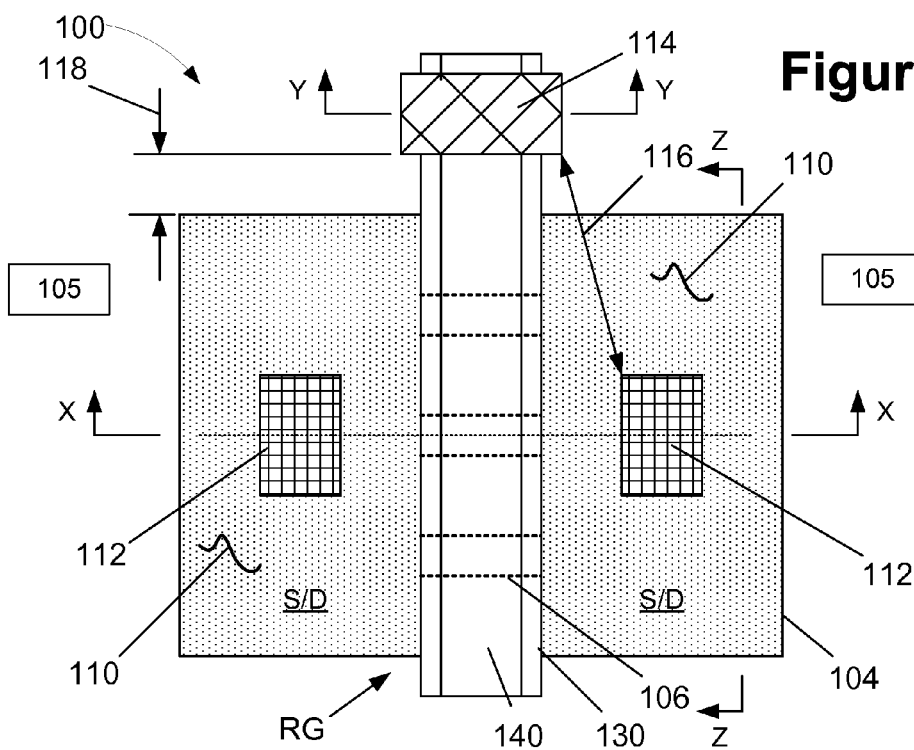
FIGS. 4A-4S depict one illustrative method disclosed herein for forming self-aligned contacts for a FinFET semiconductor device that is manufactured using a replacement gate process, and the resulting semiconductor device.
Figure 4B:
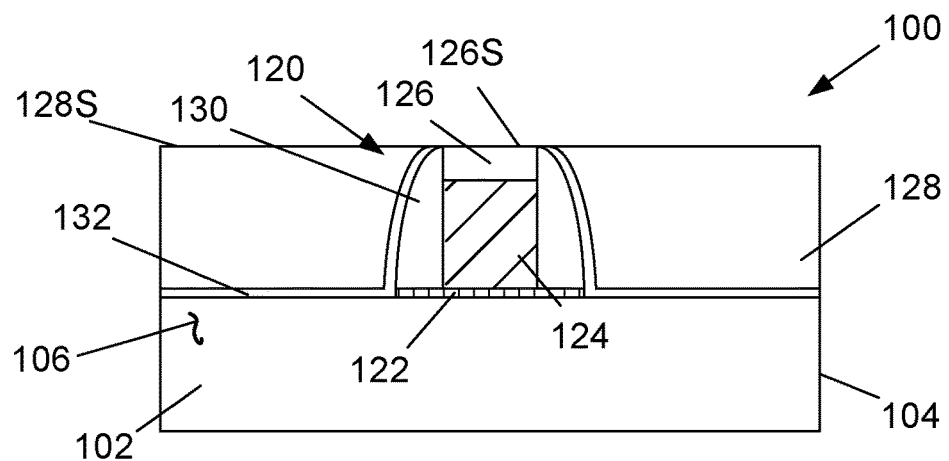
Figure 4B:
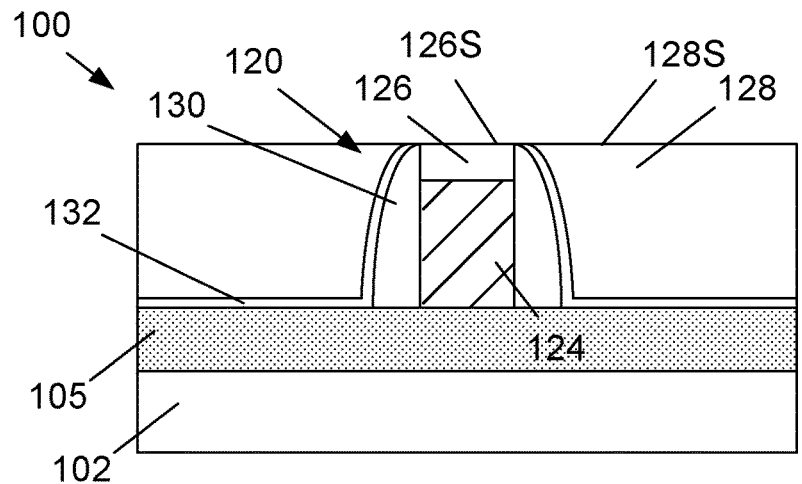
Figure 4B:
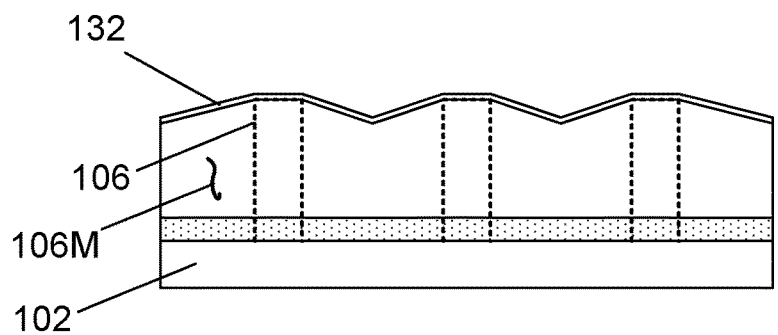
Figure 4C:
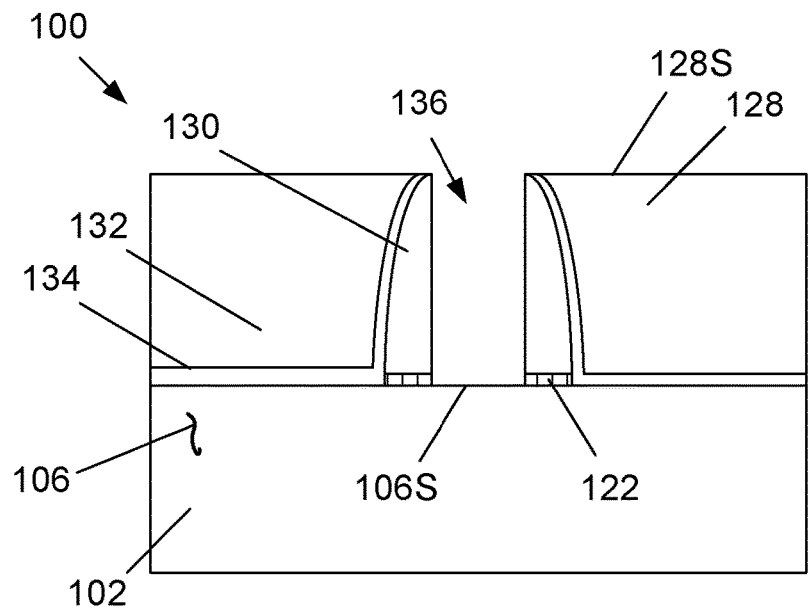
Figure 4C:
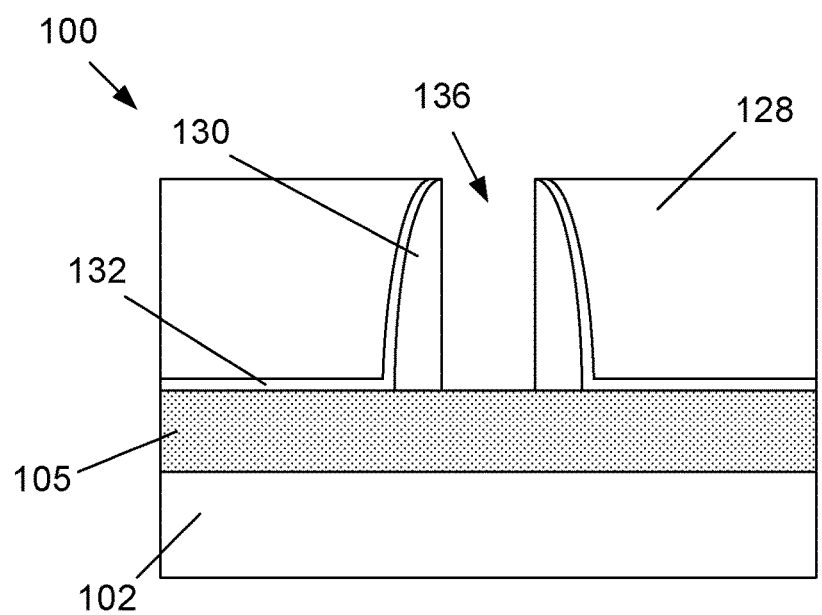
Figure 4D:
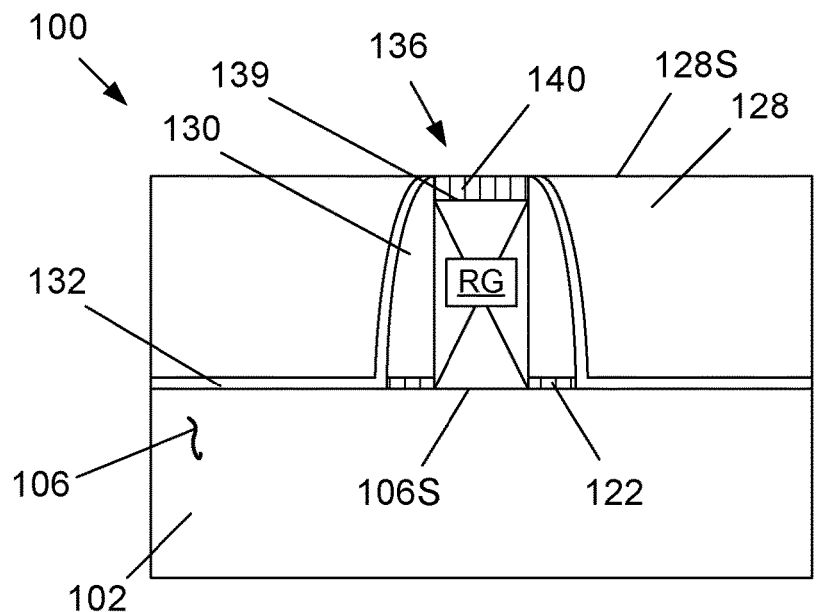
Figure 4D:
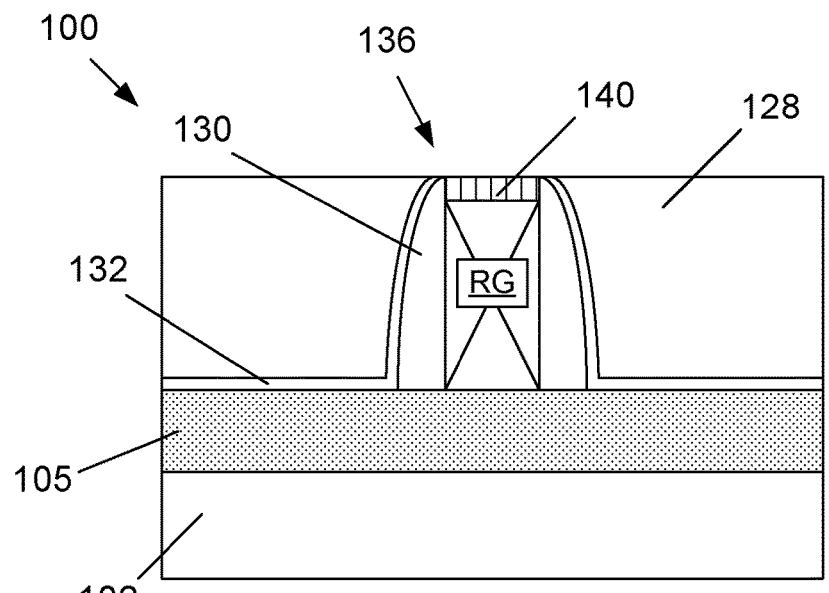
Figure 4E:
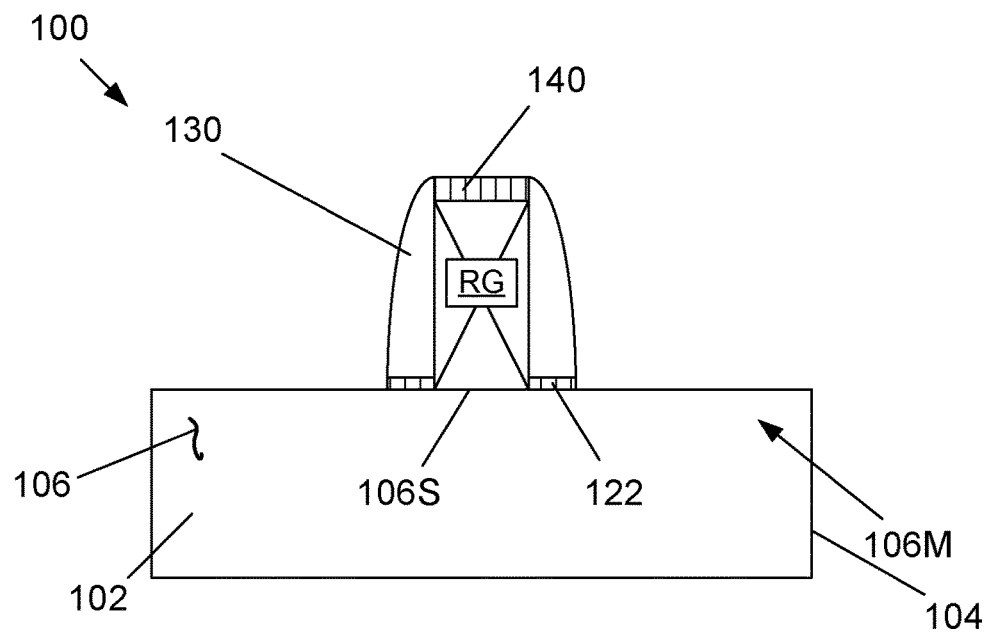
Figure 4E:
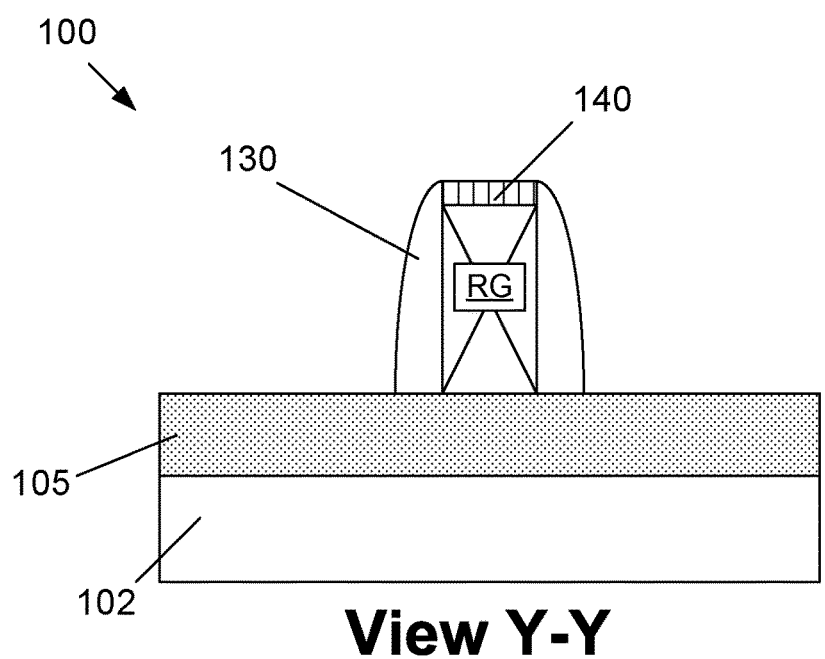
Figure 4F:
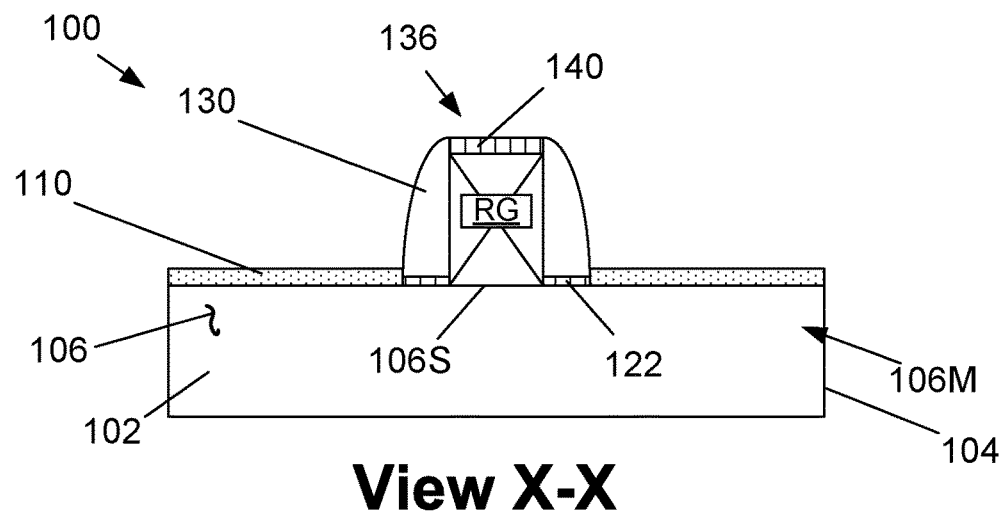
Figure 4F:
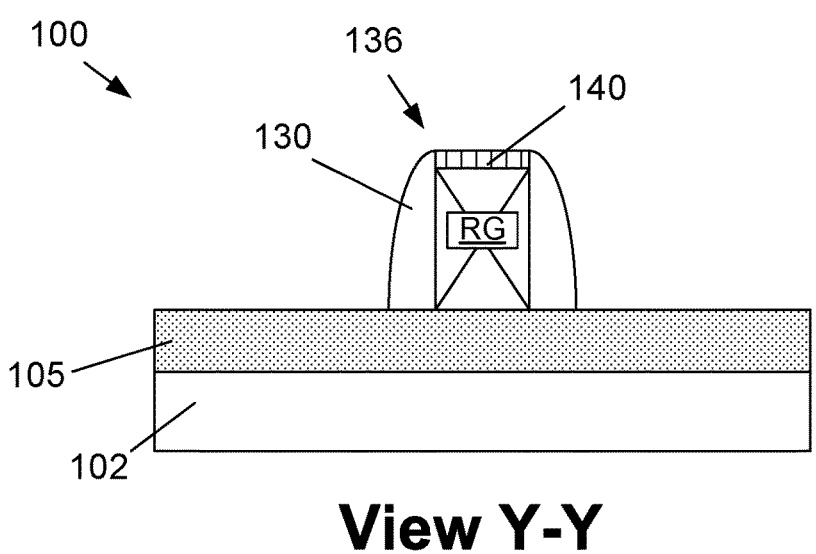
Figure 4F:
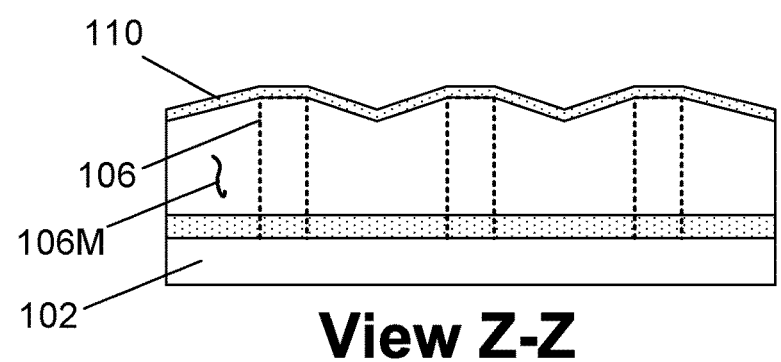
Figure 4G:
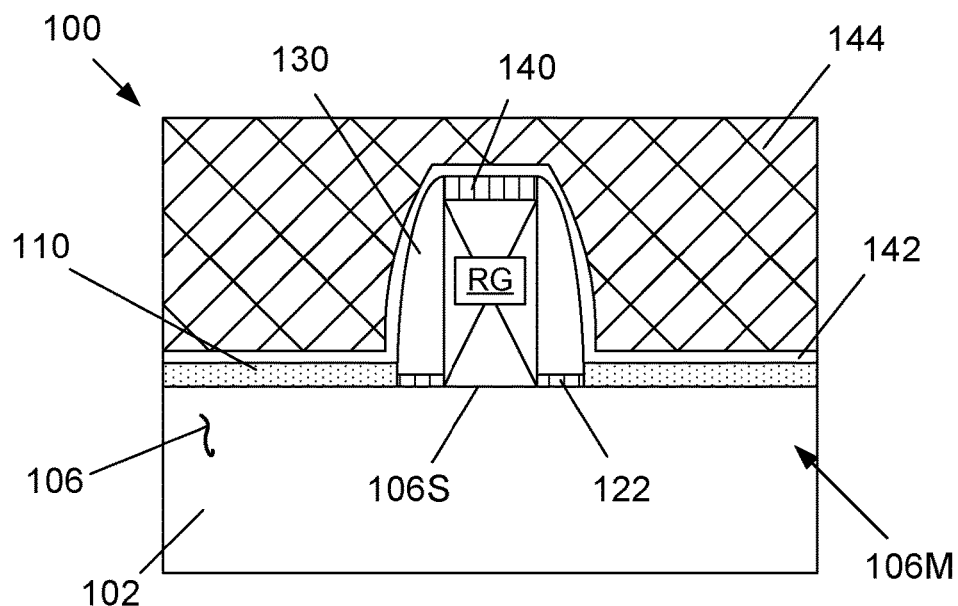
Figure 4G:
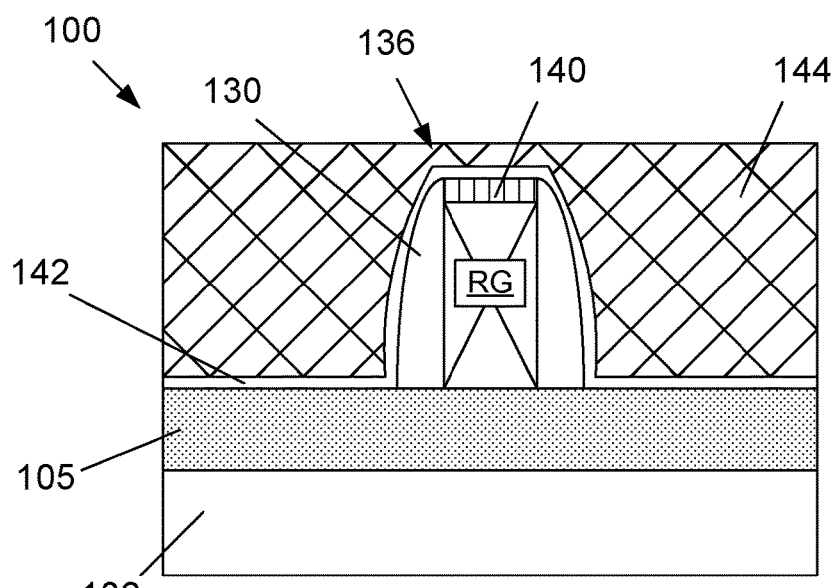
Figure 4H:
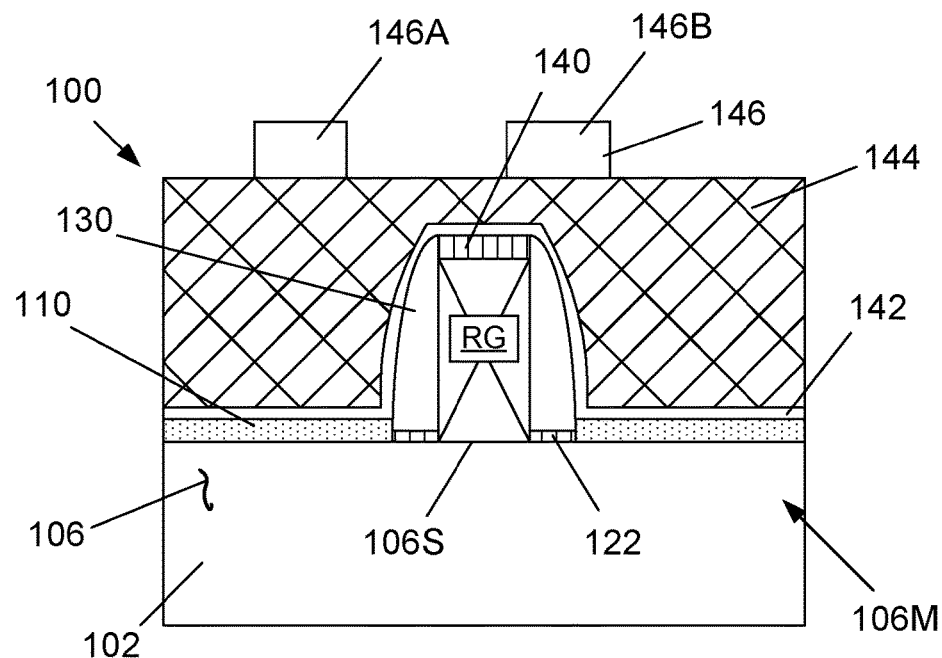
Figure 4H:
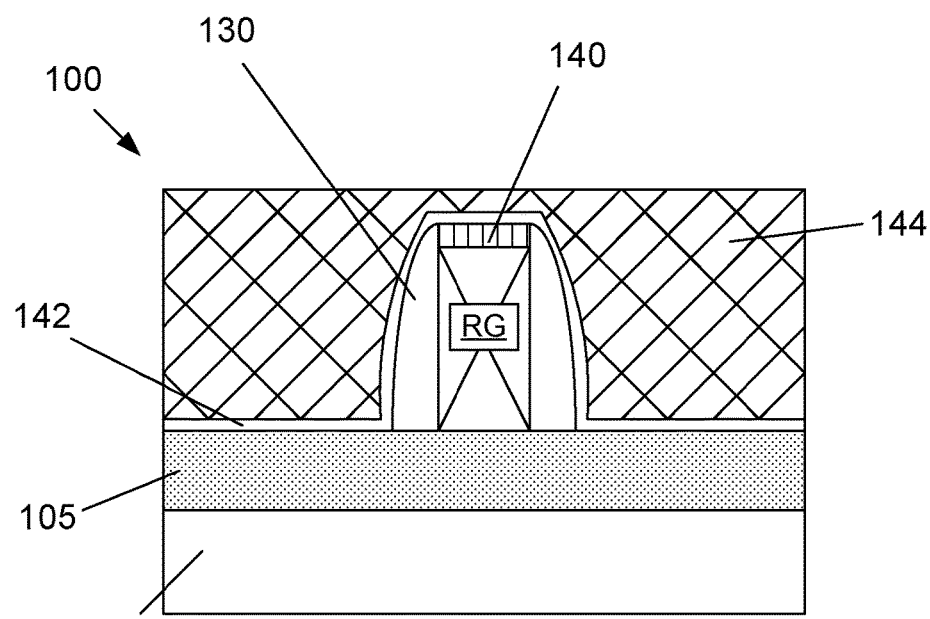
Figure 4I:
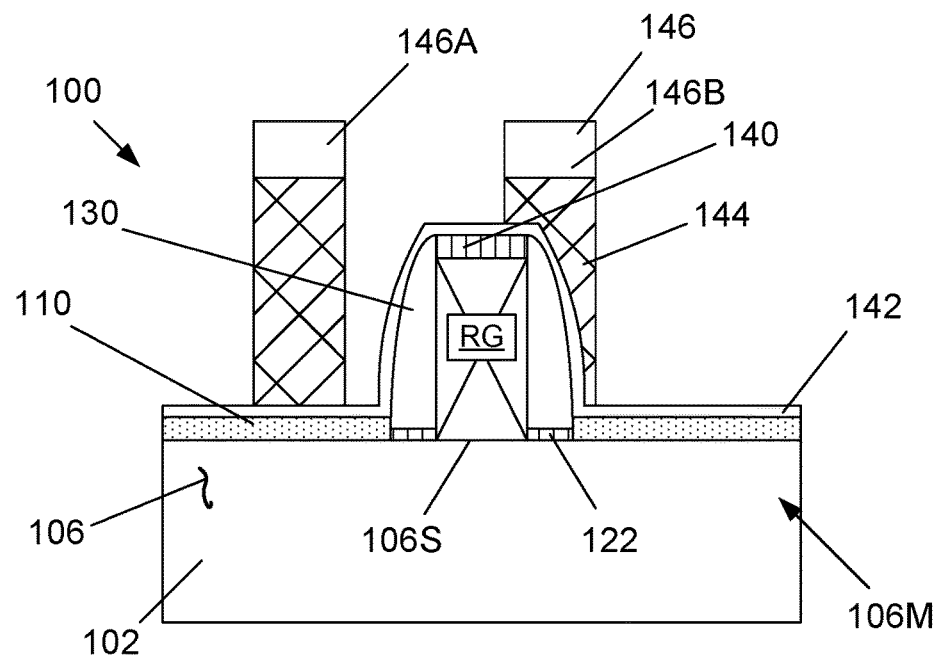
Figure 4I:
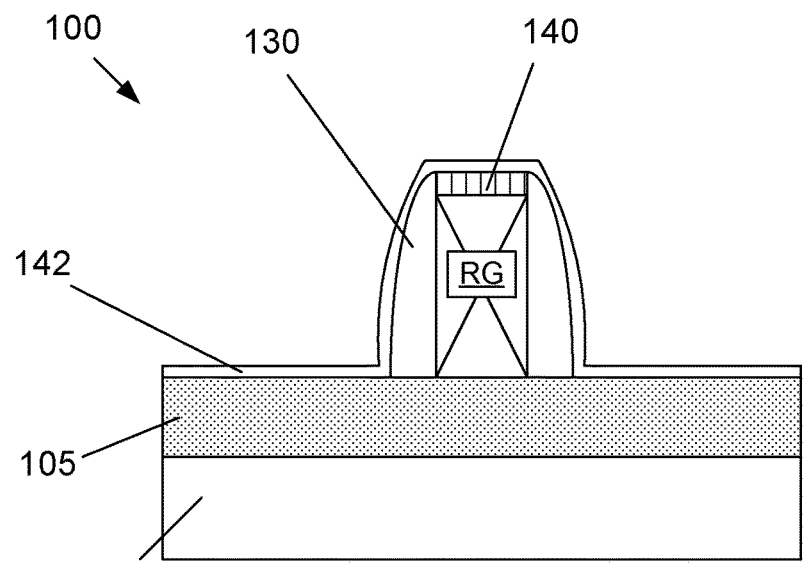
Figure 4J:
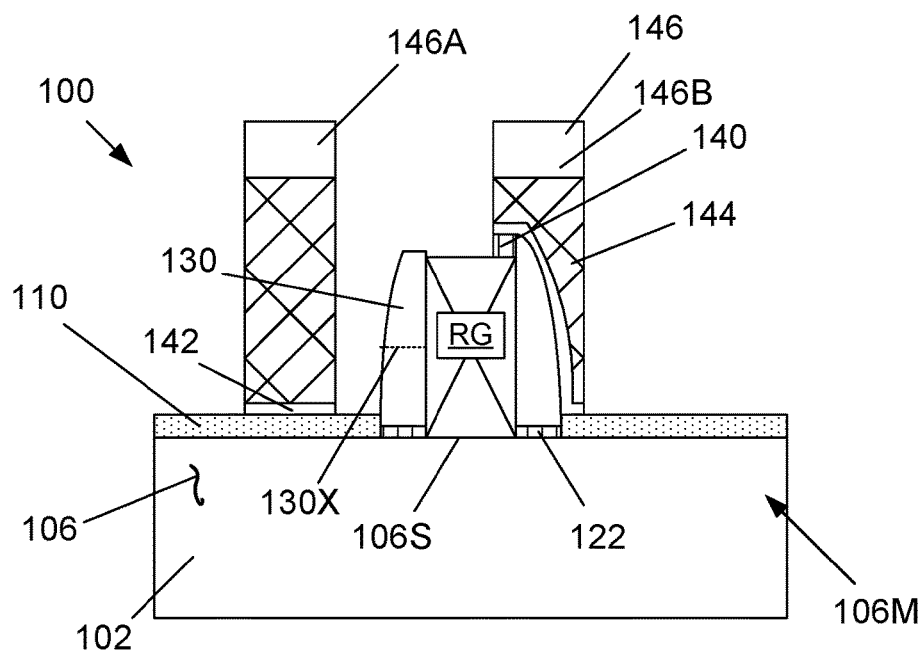
Figure 4J:
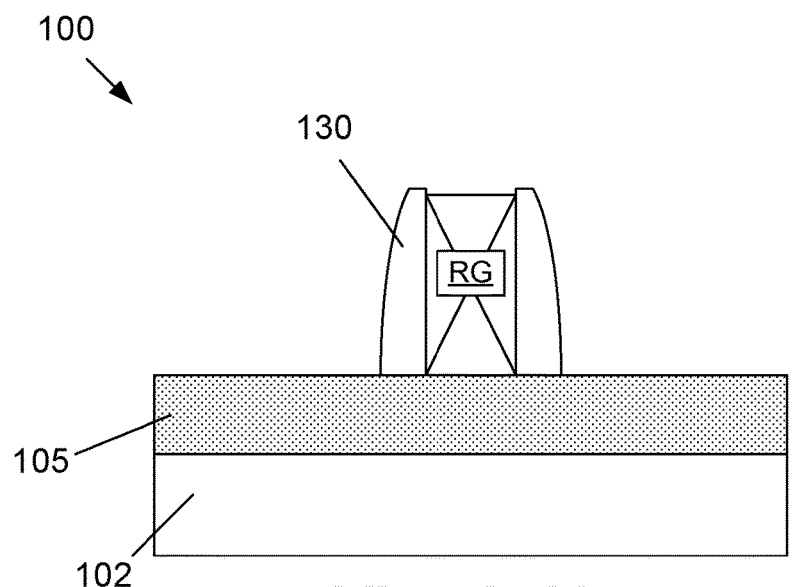
Figure 4K:
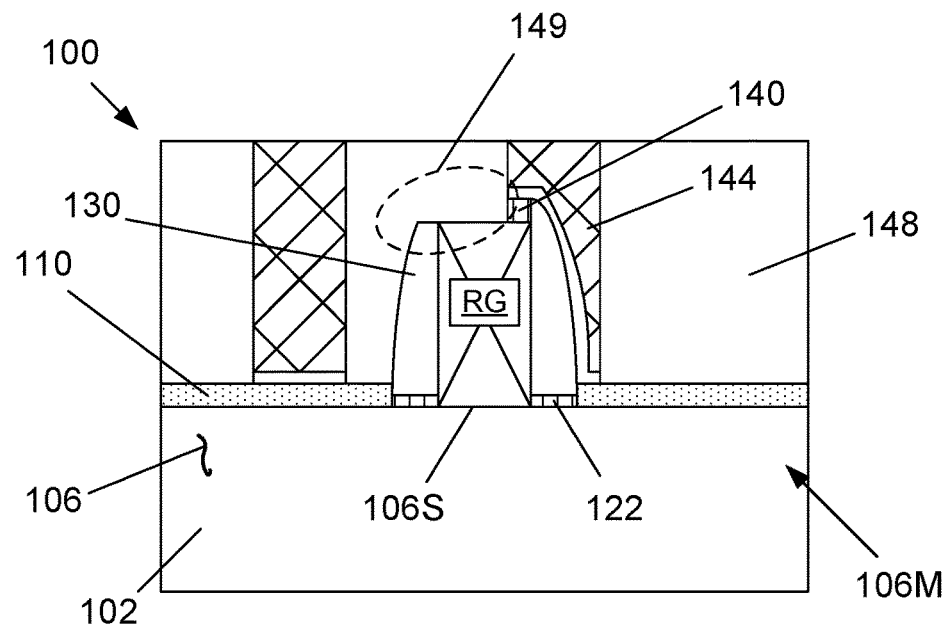
Figure 4K:
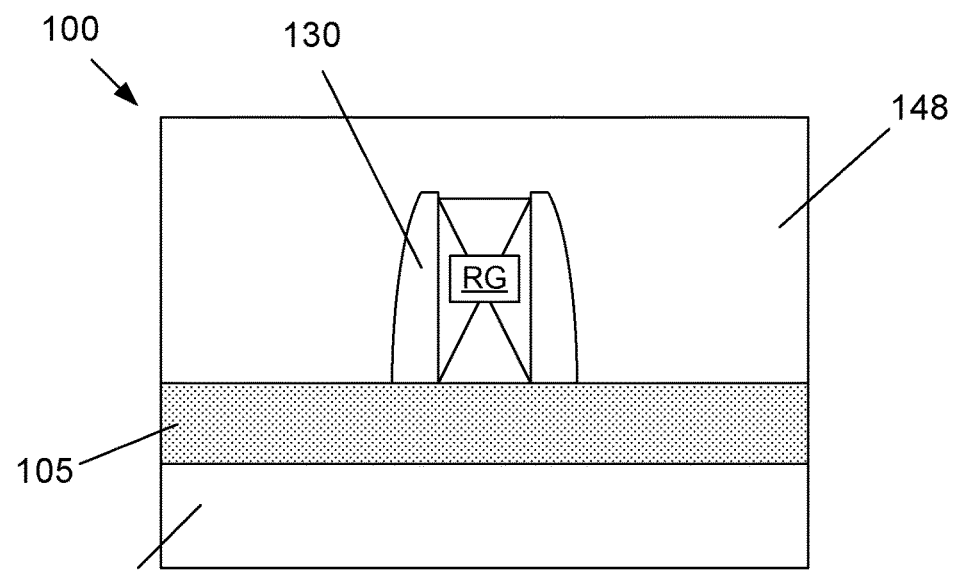
Figure 4L:
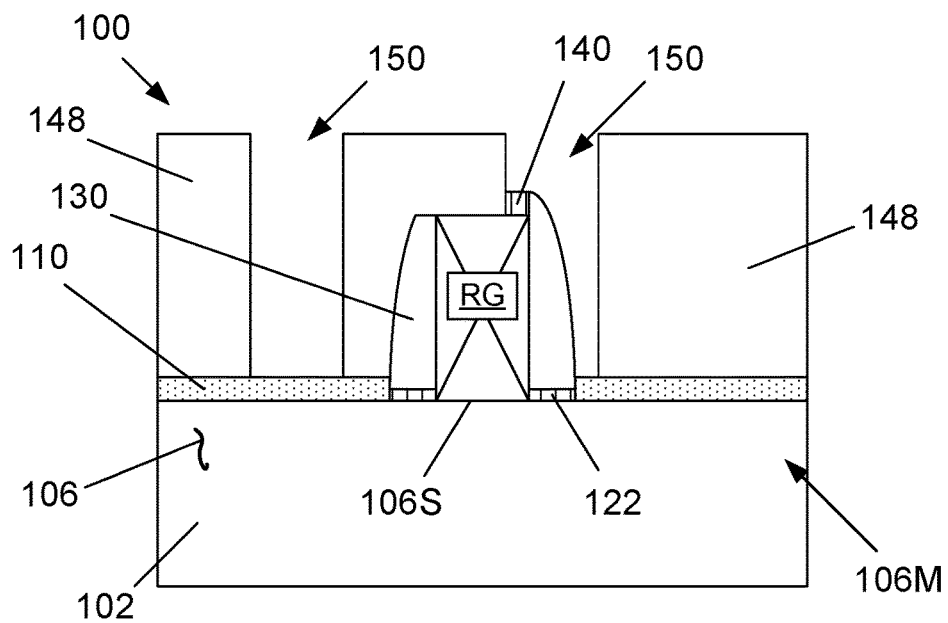
Figure 4L:
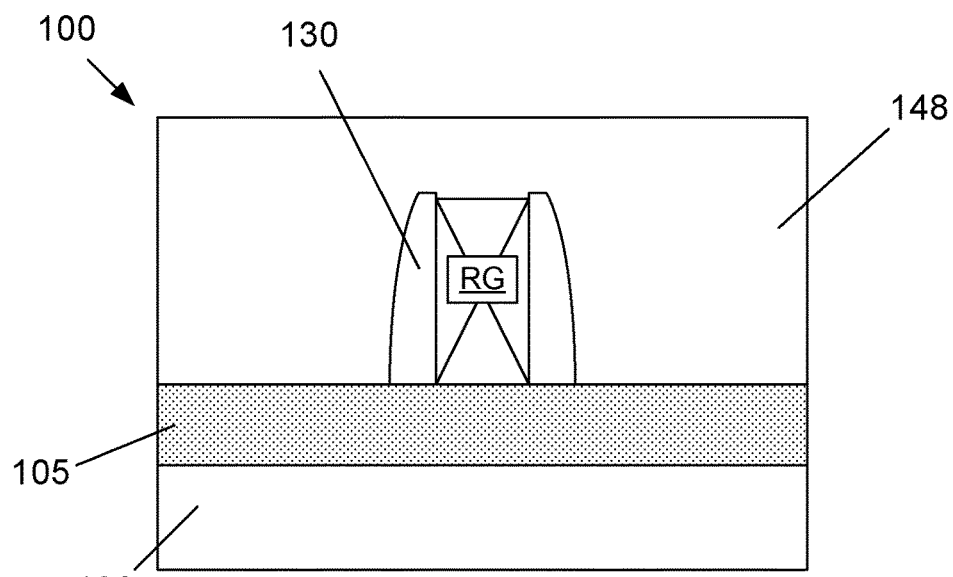
Figure 4M:
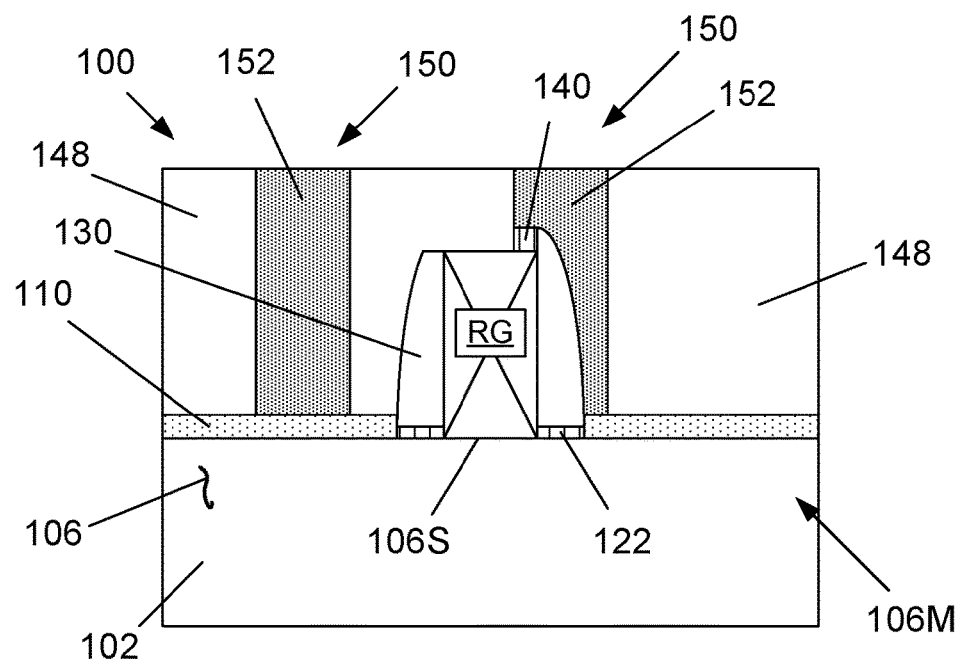
Figure 4M:
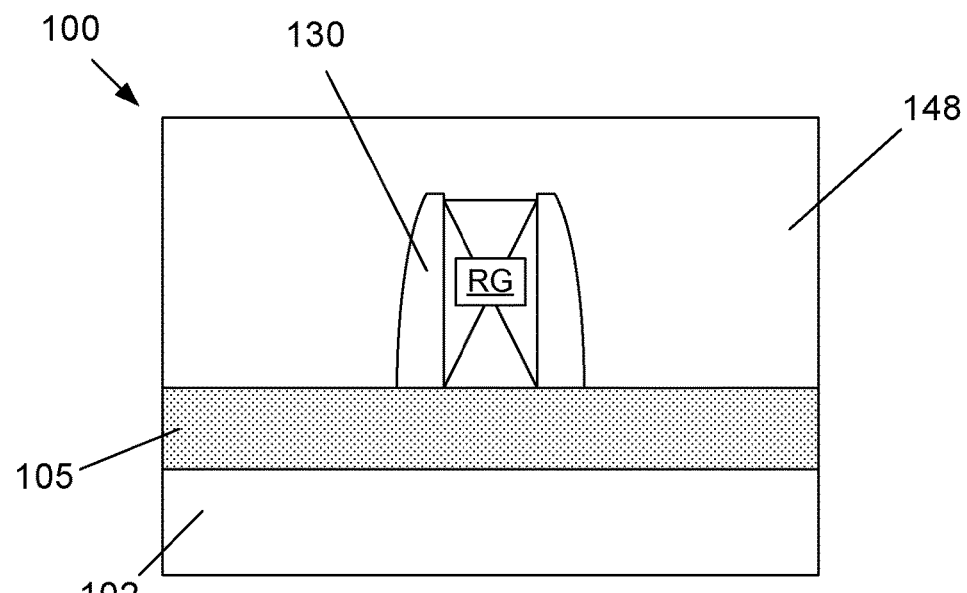
Figure 4N:
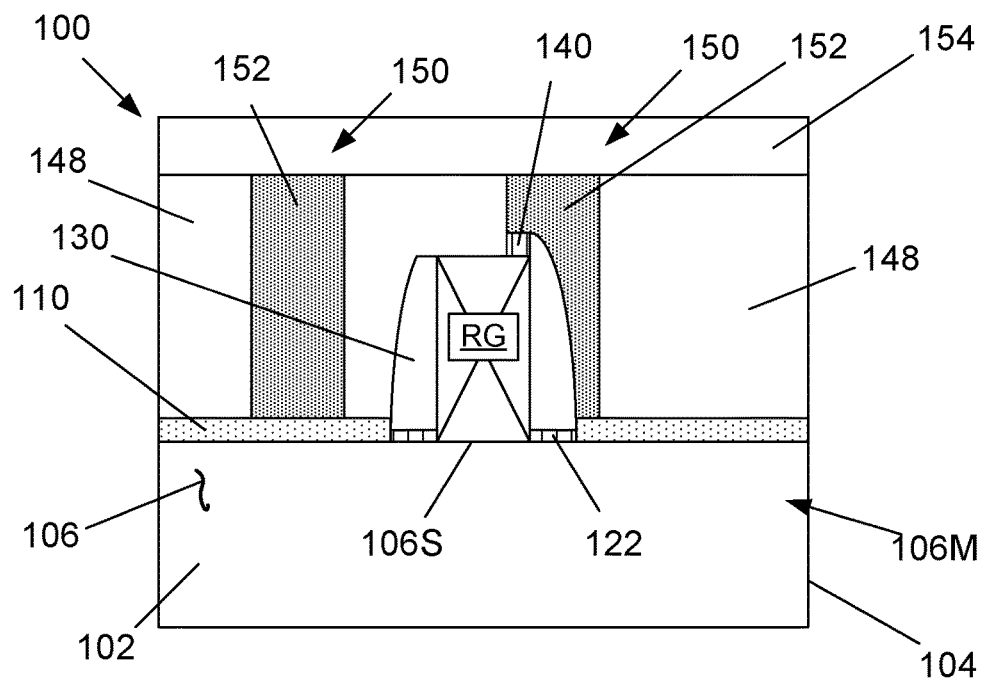
Figure 4N:
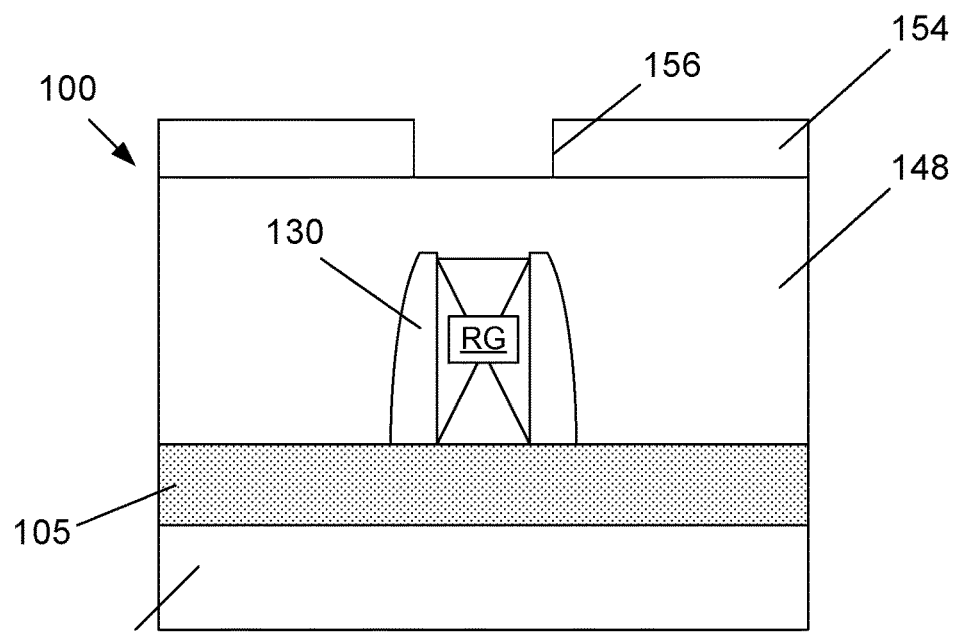
Figure 4O:
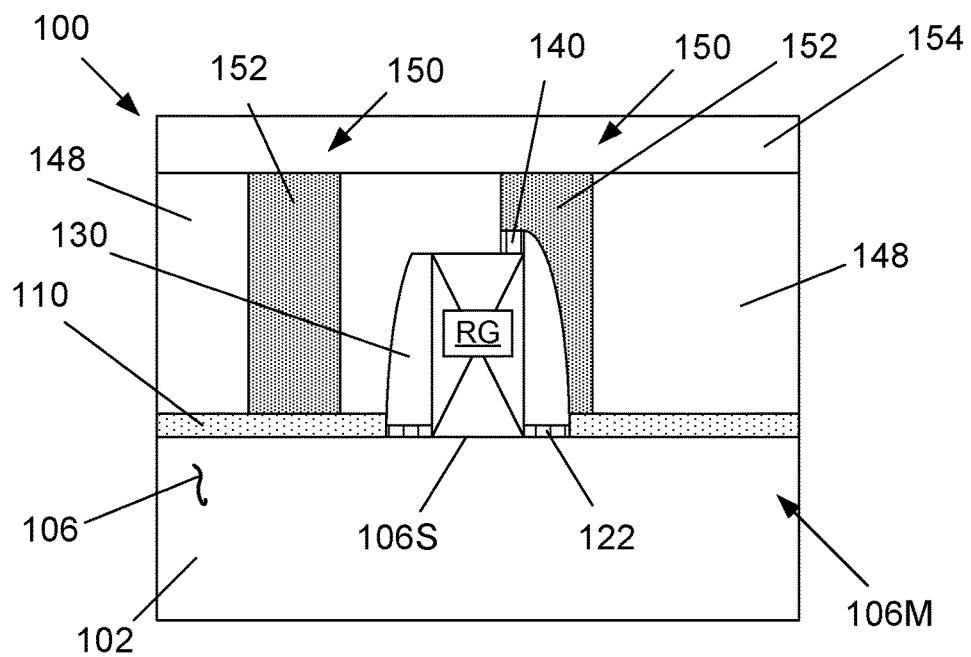
Figure 4O:
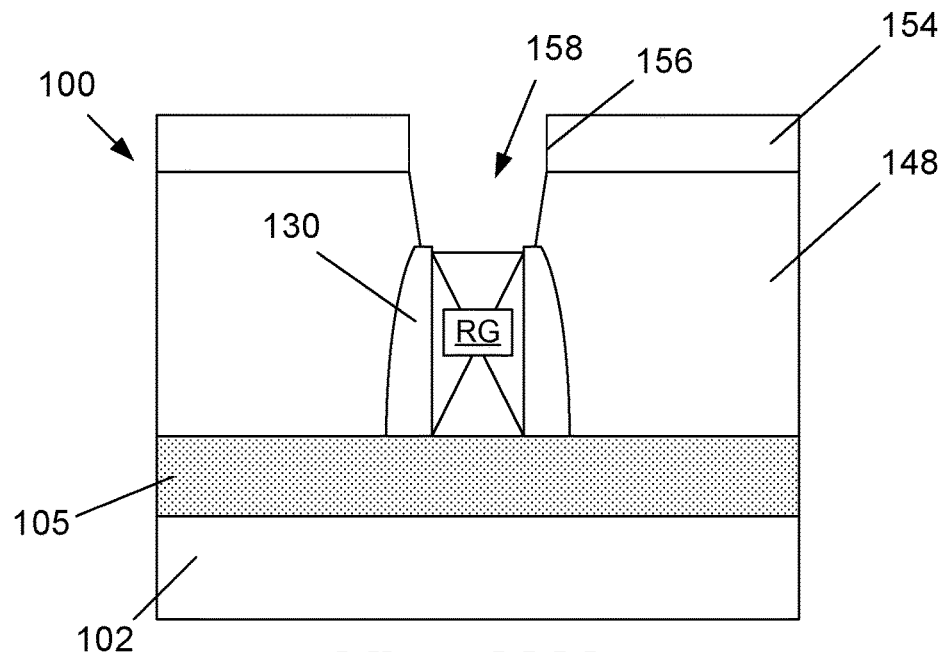
Figure 4P:
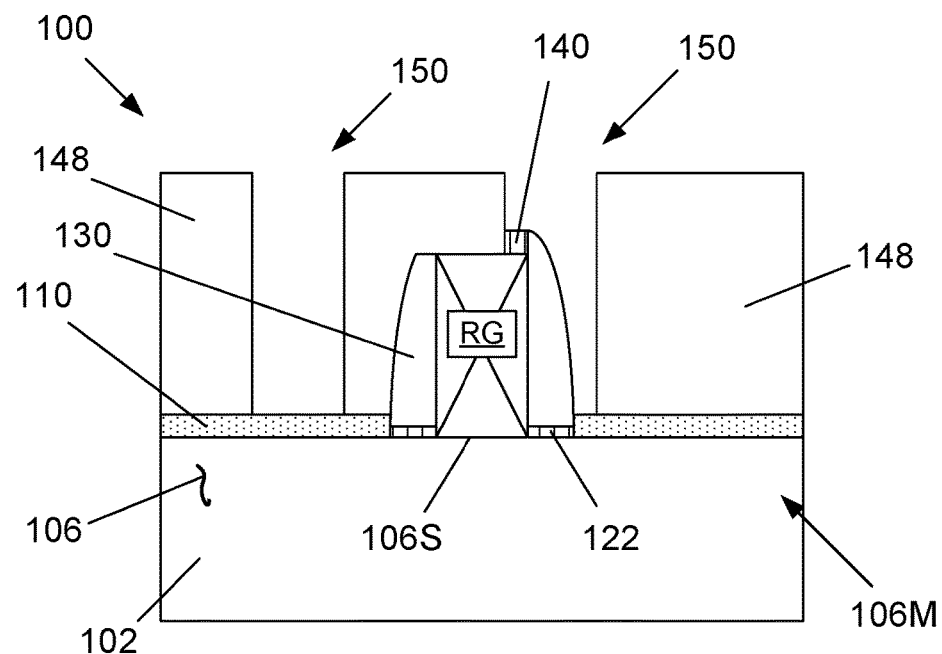
Figure 4P:
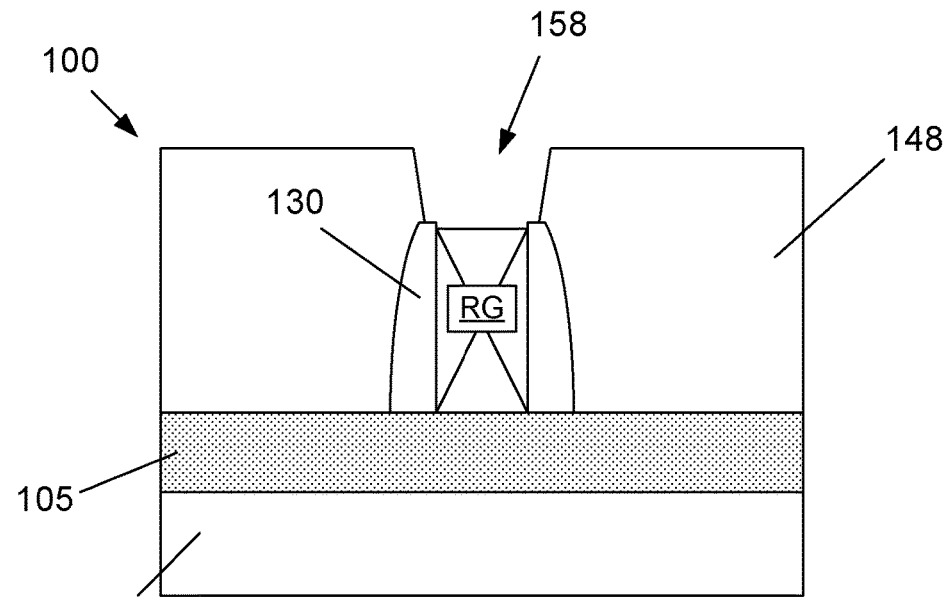
Figure 4Q:
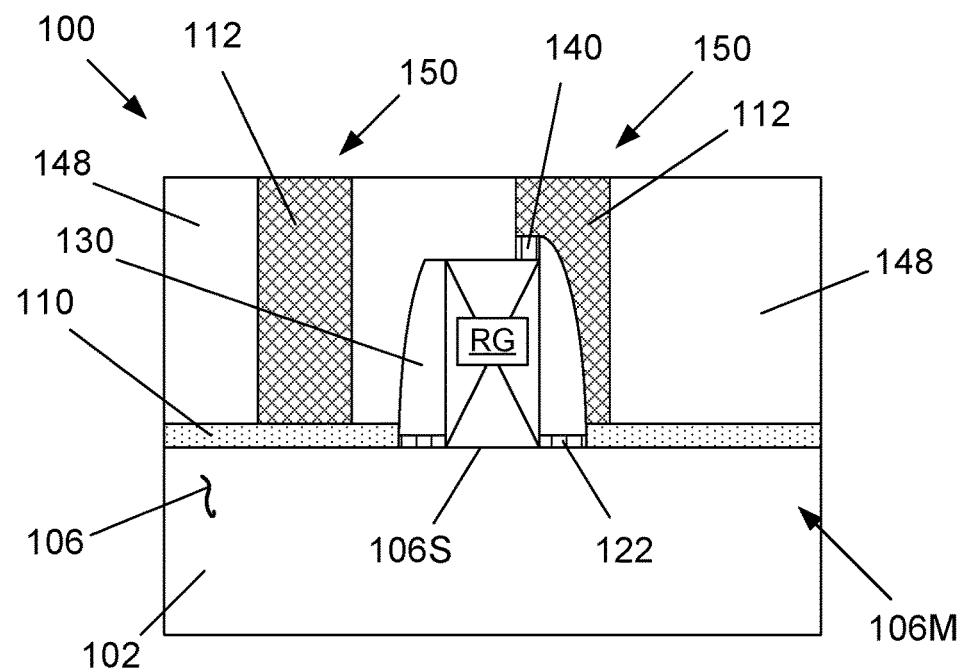
Figure 4Q:
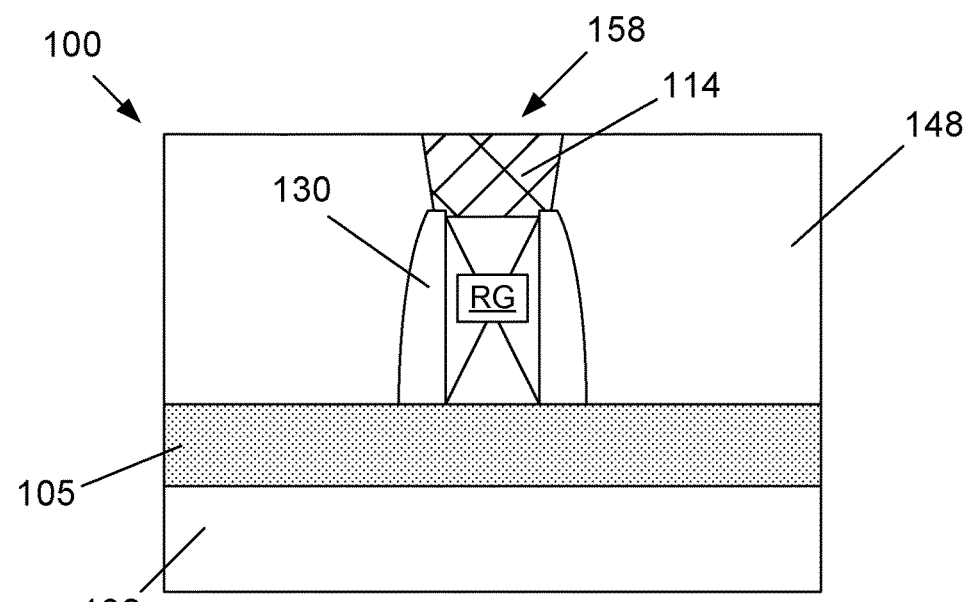
Figure 4R:
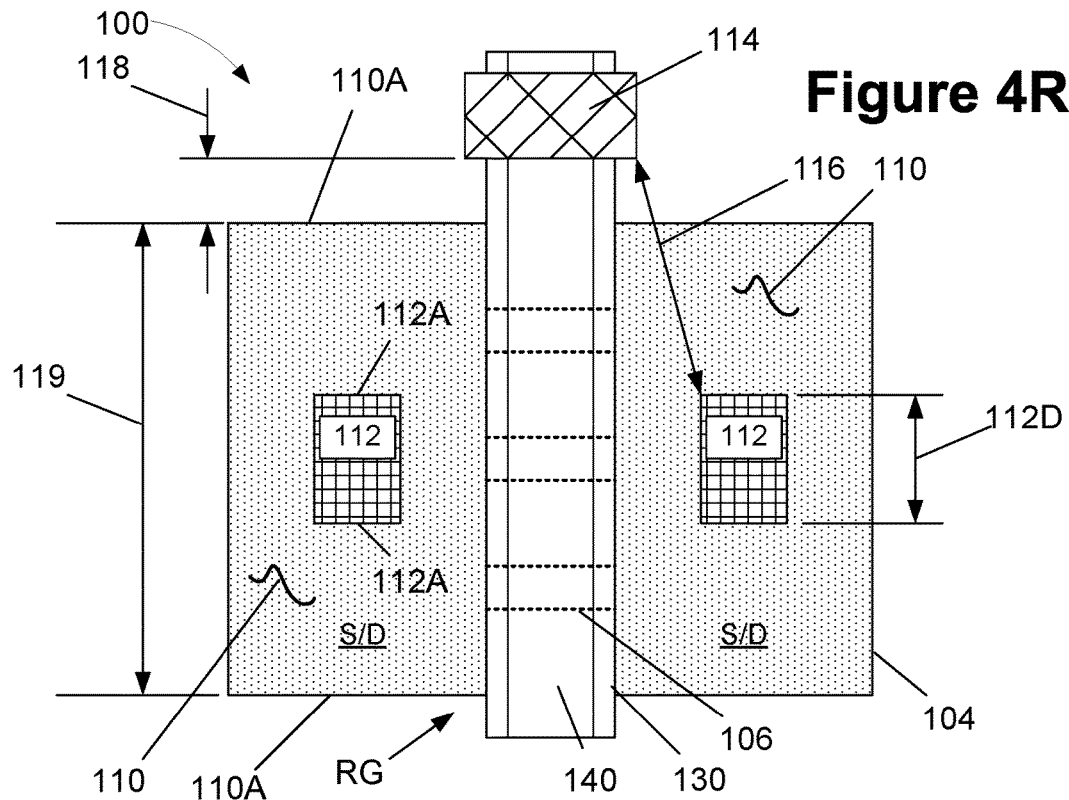
Figure 4S:
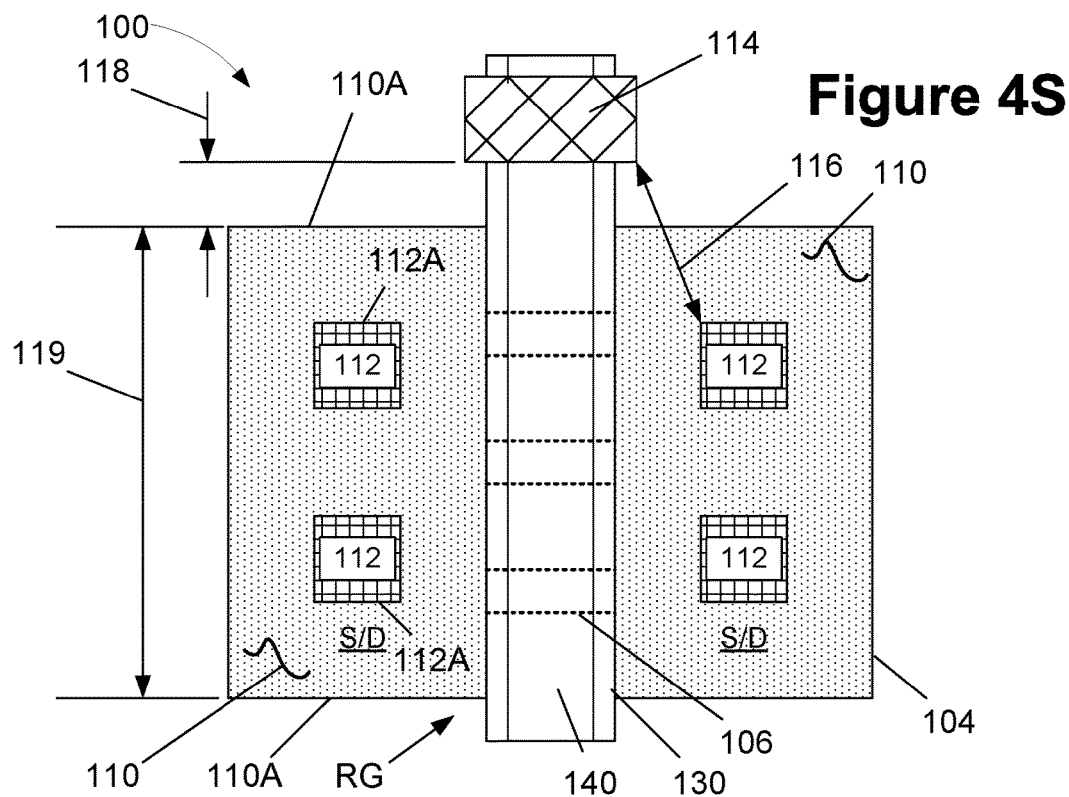

FIGS. 4A-4S depict one illustrative method disclosed herein for forming self-aligned contacts for a FinFET semiconductor device 100, and the resulting semiconductor device 100. The illustrative device 100 will be formed in and above the semiconductor substrate 102. So as not to obscure the inventions disclosed herein, an isolation region that is formed in the substrate 102 to define the active region 104 where the device 100 will be formed will not be depicted in all of the attached drawings. The device 100 may be either an NMOS or a PMOS transistor. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

Figure 2B:
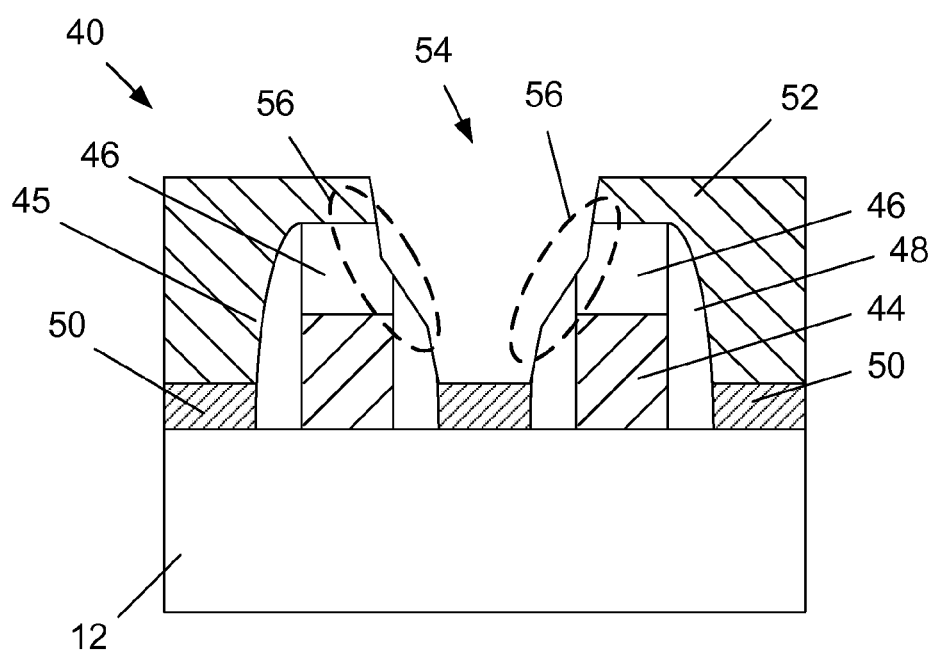

FIG. 4A is a simplistic plan view of an illustrative FinFET device 100 with various layers of insulating material that would be present removed to facilitate discussion. In the attached drawings, only a single FinFET device 100 is depicted. However, as will be appreciated by those skilled in the art, in a real-world device, additional devices would be formed very close to the device 100, much like the closely packed transistors depicted in FIGS. 2A-2B. In general, the FinFET device 100 is formed above an active region 104 that is defined in the semiconductor substrate 102 by an isolation structure 105, such as a shallow trench isolation structure. In the depicted example, the FinFET device 100 is comprised of three illustrative fins 106 (shown in dashed lines in FIG. 4A) and an illustrative replacement gate structure (RG). A sidewall spacer 130 and a gate cap layer 140 have also been formed so as to encapsulate the replacement gate structure. In this example, the fins 106 have been merged to generally define the source/drain (S/D) regions of the device 100. A metal silicide layer 110 has been formed above the entire active region 104 and the merged fins. Also depicted are illustrative post-type source/drain contact structures 112 and a gate contact structure 114. The post-type source/drain contact structures 112 are conductively coupled to source/drain regions via the metal silicide layer 110. FIG. 4A also depicts the location where various cross-sectional views depicted in the following drawings will be taken. More specifically, the view "X-X" is taken along a line that passes through the post-type source/drain contact structures 112 and the long axis of the middle fin 106, the view "Y-Y" is a cross-sectional view that is taken through the gate contact structure 114, and the view "Z-Z" is a cross-sectional view taken through the source/drain region of the device.

In the example disclosed herein, the FinFET device 100 will be formed using a replacement gate technique. Accordingly, FIG. 4B depicts the device 100 at a point in fabrication wherein a sacrificial gate structure 120 has been formed above the substrate 102 and the fins 106. Also depicted is an illustrative gate cap layer 126, sidewall spacers 130, an etch stop liner layer 132 and a layer of insulating material 128, e.g., silicon dioxide. The gate cap layer 126, sidewall spacers 130 and the etch stop liner layer 132 are typically made of silicon nitride. At this point in the replacement gate process flow, an anneal process would have already been performed to activate the implanted dopant materials and repair any damage to the substrate 102 due to the various ion implantation processes that were performed. The sacrificial gate structure 120 includes a sacrificial gate insulation layer 122 and a dummy or sacrificial gate electrode 124. The various components and structures of the device 100 may be formed using a variety of different materials and by performing a variety of known techniques. For example, the sacrificial gate insulation layer 122 may be comprised of silicon dioxide and the sacrificial gate electrode 124 may be comprised of polysilicon. The various layers of material depicted in FIG. 4B, as well as the layers of material described below, may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature. For example, with reference to FIG. 4B, the layer of insulating material 128 is formed adjacent to the sacrificial gate electrode 124, the sidewall spacers 130 and the liner 132, but, in the depicted example, the layer of insulating material 128 only contacts the etch stop liner layer 132. Similarly, it can be stated that the sidewall spacers 130 are formed either adjacent to the gate electrode 124 or contacts the gate electrode 124.

FIG. 4B (view Y-Y) depicts the illustrative isolation structure 105 that has been formed in the substrate 102. Note that, in the depicted example, the sacrificial gate insulation layer 122 is not shown in FIG. 4B (view Y-Y) since the sacrificial gate insulation layer 122 was formed by a thermal oxidation process.

With reference to FIG. 4B (view Z-Z), after the sacrificial gate structure 120 was formed and after all of the desired implantation processes were performed, a fin merger process was performed to grow an epi semiconductor material 106M on the portions of the fins 106 positioned outside of the spacers 130. For reference purposes, the original shape of the fins 106 is depicted in dashed lines in FIG. 4B (view Z-Z). The illustrative FinFET device 100 disclosed herein will be depicted as being comprised of three illustrative fins 106. However, as will be recognized by those skilled in the art after a complete reading of the present application, the methods and devices disclosed herein may be employed when manufacturing FinFET devices having any number of fins. After the fin merger process was performed, the etch stop liner layer 132 and the layer of insulating material 128 was formed above the device 100 using traditional deposition techniques. With continuing reference to FIG. 4B (view X-X), a planarization process was then performed on the layer of insulating material 128 such that the upper surface 128S of the layer of insulating material 128 is substantially even with the upper surface 126S of the gate cap layer 126. Importantly, this planarization process exposes the upper surface 126S of the gate cap layer 126 such that it can be removed. In one illustrative embodiment, the planarization process may be a chemical mechanical planarization (CMP) process that stops on the gate cap layer 126.

FIG. 4C depicts the device 100 after one or more wet or dry etching processes were performed to remove the gate cap layer 126, the sacrificial gate electrode 124 and the sacrificial gate insulation layer 122 to thereby define a gate cavity 136 where a replacement gate structure will subsequently be formed for the device 100. Typically, the sacrificial gate insulation layer 122 is removed as part of the replacement gate technique, as depicted herein. However, the sacrificial gate insulation layer 122 may not be removed in all applications. Even in cases where the sacrificial gate insulation layer 122 is intentionally removed, there will typically be a very thin native oxide layer (not shown) that forms on the surface 106S of the fins within the gate cavity 136. To the extent that the removal of the sacrificial gate structure 120 causes any consumption of the isolation region 105 (FIG. 4C (view Y-Y)), such consumption is not depicted in the attached drawings.

FIG. 4D depicts the product after several process operations were performed. First, a pre-clean process was performed in an attempt to remove all foreign materials from within the gate cavity 136 prior to forming the various layers of material that will become part of the replacement gate structure. Thereafter, several known processing operations were performed to form a schematically depicted replacement gate structure (RG) in the gate cavity 136. The replacement gate structure depicted herein is intended to be representative in nature of any type of gate structure that may be employed in manufacturing integrated circuit products using so-called gate-last (replacement gate) manufacturing techniques. The replacement gate structure typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum.

With continuing reference to FIG. 4D, one or more dry or wet etching processes were performed to remove portions of the materials of the replacement gate structure. This recessing process defines a recess 139, the depth of which may vary depending upon the particular application. FIG. 4D depicts the device 100 after a gate cap layer 140 was formed in the recess 139. The gate cap layer 140 may be comprised of a variety of materials, e.g., silicon nitride, or a bottom layer of silicon dioxide covered with an upper layer of silicon nitride. In one embodiment, the gate cap layer 140 may be formed by blanket-depositing a cap layer material, e.g., silicon nitride, on the device 100 so as to over-fill the cavity 139. Then, one or more planarization processes, e.g., CMP processes, may be performed to remove the portions of the cap layer material positioned above the surface 128S of the layer of insulating material 128 and outside of the recess 139. In one illustrative embodiment, using the methods disclosed herein, the gate cap layer 140 may be formed much thinner (e.g., 10-20 nm) than traditional gate cap layers (e.g., 30-40 nm) that are formed using prior art process flows.

FIG. 4E depicts the product 100 after one or more dry or wet etching processes were performed to remove portions of the layer of insulating material 128 and the etch stop liner layer 132 so as to expose the merged fins 106M within the active region 104. In one embodiment, the removal process may be a wet etching process (using, for example, BHF) that exhibits better etch selectivity between nitride and oxide, such that damage to the silicon nitride cap layer 140 and spacer 130 may be less during the contact etch sequence.

FIG. 4F depicts the device 100 after a traditional silicidation process was performed to form the metal silicide layer 110 above the entire active region 104 on the merged fins 106M. The metal silicide layer 110 may have a nominal thickness of about 5-15 nm, depending upon the particular application. In general, such a silicidation process typically involves depositing a layer of metal (not shown), such as nickel, cobalt, titanium, platinum, etc., or a combination of such materials, such that it contacts the exposed portions of the active region 104/merged fins 106M. Then, a first anneal process is performed at a temperature that falls within the range of about 220-300° C. such that the layer of metal reacts with the silicon in the silicon-containing regions contacted by the layer of metal to thereby form a relatively higher resistance form of metal silicide. Next, portions of the layer of metal that did not react with the underlying active region 104/merged fins 106M during the first anneal process are removed by performing a standard stripping process. After the removal of the unreacted portions of the layer of metal, a second anneal process is performed on the device 100 at a temperature that falls within the range of about 400-500° C. so as to convert the relatively higher resistance silicide region into the relatively lower resistance metal silicide layer 110. Of course, the metal silicide layer 110 does not form on the isolation region 105 (see FIG. 4F (view Y-Y)). Importantly, by forming the metal silicide layer 110 after the above-described fin merger process was performed and after the replacement gate structure (RG) was formed (see FIG. 4D), the metal silicide layer 110 is not exposed to the relatively high processing temperatures that may be associated with those activities. That is, a metal silicide material usually becomes unstable and its resistance increases if it is exposed to anneal temperatures greater than about 700° C.

FIG. 4G depicts the device 100 after an etch stop liner layer 142 was formed on the metal silicide layer 110 and after a sacrificial material layer 144 was formed above the etch stop liner layer 142 using traditional deposition techniques. For example, the etch stop liner layer 142 may be comprised of a variety of different materials, e.g., silicon dioxide, hafnium oxide, etc. The sacrificial material layer 144 may also be comprised of a variety of different materials, e.g., amorphous silicon, polysilicon, etc. After the sacrificial material layer 144 is initially deposited, its upper surface may be planarized by performing a CMP process.

FIG. 4H depicts the device 100 after a patterned etch mask 146 is formed above the sacrificial material layer 144. In one illustrative embodiment, the patterned etch mask 146 is a patterned layer of photoresist that is formed using traditional photolithography tools and techniques. In the example depicted herein, the patterned etch mask 146 is a "reverse" etch mask in that the features 146A, 146B in the patterned etch mask 146 correspond to the shape and configuration of the post-type source/drain contact structures 112 shown in FIG. 4A. The patterned etch mask 146 also exposes the area around the gate contact structure 114, as depicted in FIG. 4H (view Y-Y).

FIG. 4I depicts the product 100 after one or more dry or wet etching processes were performed through the patterned etch mask 146 to remove unmasked portions of the sacrificial material layer 144. This etching process stops on the etch stop liner layer 142.

FIG. 4J depicts the product 100 after one or more dry or wet etching processes were performed through the patterned etch mask 146 to remove portions of the etch stop liner layer 142 that are not protected by the remaining portions of the now-etched sacrificial material layer 144. If desired, after the exposed portions of the etch stop liner layer 142 are removed, an etching process may be performed with an etch chemistry that attacks the exposed portions of the sidewall spacer 130 and the gate cap layer 140. If desired, this latter etching process may be continued so as to recess the exposed sidewall spacer 130 as much as desired within reason. For example, the etching process may be performed until the spacer is recessed to the level indicated by the line 130X.

FIG. 4K depicts the device 100 after the patterned etch mask 146 was removed and after a layer of insulating material 148, e.g., silicon dioxide, was formed above the device 100 using traditional deposition techniques. After the layer of insulating material 148 is initially deposited, its upper surface may be planarized by performing a CMP process. This planarization process is performed to insure that the remaining portions of the patterned sacrificial material layer 144 are exposed for further processing. Note that, using the method disclosed herein, in the region 149, materials having a relatively lower dielectric constant, e.g., the gate cap layer 140 and spacer 130 (silicon nitride; k=about 7) was replaced with a material 148, e.g., silicon dioxide, having a lower k value (about 3.8). In some cases, the material 148 may be comprised of an even lower k-value material, e.g., k value less than 3.6. Thus, the methods disclosed herein provide a means to use lower-k value material near at least some portion of the replacement gate structure. The use of such lower k value material will tend to reduce the magnitude of undesirable parasitic capacitance losses when the device is in operation.

FIG. 4L depicts the product 100 after one or more dry or wet etching processes were performed to remove the exposed portions of the sacrificial material layer 144. This etching process stops on the metal silicide layer 110 and results in the formation of source/drain contact openings 150 where the post-type source/drain contact structures 112 will be subsequently formed. The openings 150 may be of any desired cross-sectional configuration when viewed from above, e.g., square, rectangular, round, etc. In one embodiment, where the sacrificial material layer 144 is comprised of amorphous silicon, it may be removed by performing a hot ammonia etch process that is very selective to silicon dioxide such that there is little, if any, damage to the silicon nitride cap layer 140 and the silicon nitride spacers 130.

FIG. 4M depicts the device 100 after a sacrificial material 152 has been formed in the openings 150. The sacrificial material 152 may be any type of material that may readily fill the openings 150 and one that may be selectively removed relative to the surrounding materials. In one illustrative embodiment, the sacrificial material may be an OPL material. After the sacrificial material 152 is initially deposited, its upper surface may be planarized by performing a CMP process.

FIG. 4N depicts the device 100 after a patterned etch mask 154 is formed above the sacrificial material 152 and the layer of insulating material 148. In one illustrative embodiment, the patterned etch mask 154 is a patterned layer of photoresist that is formed using traditional photolithography tools and techniques. In the example depicted herein, the patterned etch mask 154 has an opening 156 that corresponds to the shape and configuration of the gate contact structure 114, as depicted in FIG. 4H (view Y-Y). The patterned etch mask 154 covers the area above the active region 104 and the sacrificial material 152 in the openings 150. In one alternative process flow, the sacrificial material 152 and the patterned etch mask 154 may be formed of the same material, e.g., OPL. In such a flow, the OPL material would be applied by a spin-coating process so as to overfill the openings 150 and at the same time provide sufficient OPL material so as to effectively blanket-deposit the OPL material above the entire surface of the layer of insulating material 148. The OPL material tends to be self-planarizing in nature. At that point, an arc layer (not shown) and a patterned layer of photoresist (with an opening corresponding to 156 formed therein) would be formed above the OPL material. An etching process would then be performed to pattern the arc layer to have an opening corresponding to the opening 156. At that point, the patterned layer of photoresist and the exposed OPL material would be etched away in a common etching process, which would result in the transfer of the opening 156 to the OPL material. At that point, the arc layer would be removed, leaving a patterned mask layer comprised of OPL material (with the opening 156 formed therein) that also fills the contact openings 150 with OPL material.

FIG. 4O depicts the product 100 after one or more dry or wet etching processes were performed through the patterned etch mask 154 to remove unmasked portions of the layer of insulating material 148 and the cap layer 140, thereby exposing the gate electrode (not separately shown) of the replacement gate. These etching processes result in the formation of a gate contact opening 158, as depicted in FIG. 4H (view Y-Y), where the gate contact structure 114 will be subsequently formed. The gate contact opening 158 may be of any desired cross-sectional configuration when viewed from above, e.g., square, rectangular, round, etc.

FIG. 4P depicts the device 100 after the patterned etch mask 154 and the sacrificial material 152 (or the combined OPL material 152/154) was removed by performing known stripping or etching processes.

FIG. 4Q depicts the device 100 after illustrative post-type source/drain contact structures 112 (self-aligned contacts) have been formed in the openings 150 such that it is conductively coupled to the metal silicide layer 110, and after the gate contact structure 114 has been formed in the opening 158 such that it is conductively coupled to the replacement gate structure (RG). In one embodiment, the post-type source/drain contact structures 112 and the gate contact structure 114 may be formed by performing common deposition and planarization processes, as depicted in the attached drawings. The post-type source/drain contact structures 112 and the gate contact structure 114 are intended to be schematic and representative in nature, as they may be formed using any of a variety of different conductive materials and by performing traditional manufacturing operations. The contact structures 112/114 may also contain one or more barrier layers (not depicted). In one illustrative example, the contact structures 112/114 may be formed by depositing a liner, e.g., Ti, TiN, followed by overfilling the contact openings 150/158 with a conductive material, such as tungsten. Thereafter, a CMP process may be performed to planarize the upper surface of the layer of insulating material 148, which results in the removal of excess portions of the liner and the tungsten positioned above the layer of insulating material 148 outside of the openings 150/158 and the formation of the contact structures 112/114.

In the depicted example, the post-type source/drain contact structures 112 to the right of the replacement gate structure is depicted as being somewhat misaligned or enlarged such that portions of the gate cap layer 140 and the sidewall spacer 130 were exposed when the contact opening 150 was formed. On the other hand, the contact structure 112 on the left side of the replacement gate structure is depicted as being more or less precisely aligned, although the spacing between the contact structure 112 on the left and the spacer 130 may not exist nor be as large on a real-world device.

Figure 3:
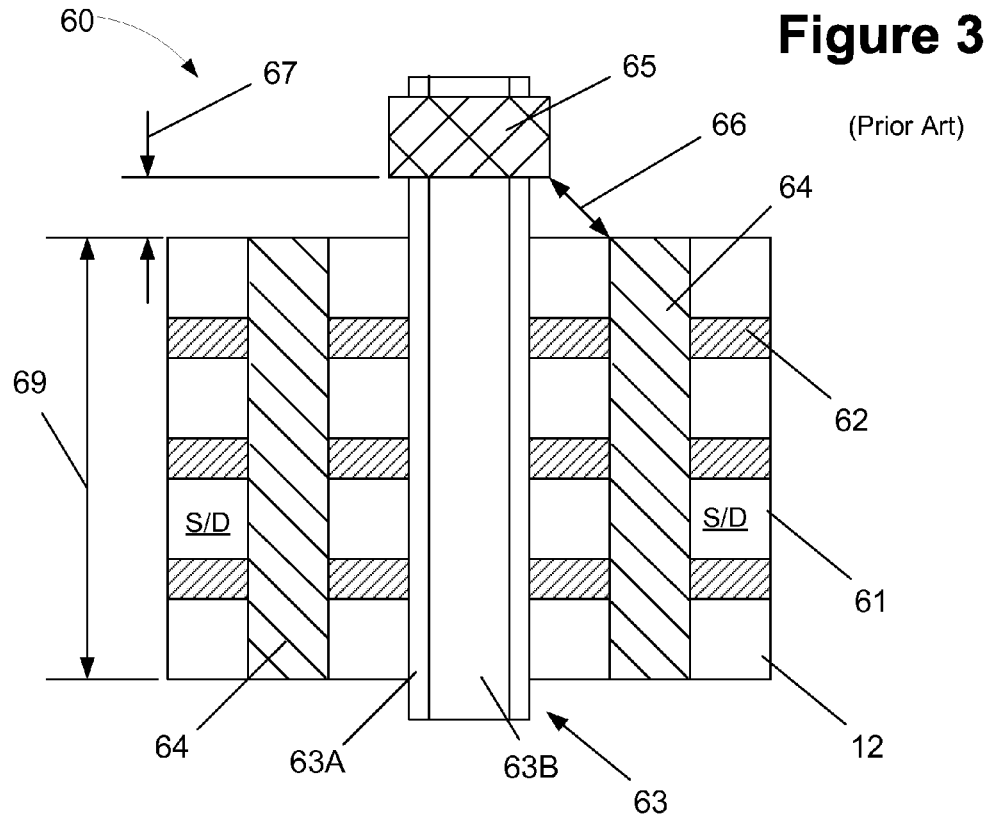
FIG. 3 is a simplistic plan view of one illustrative embodiment of a prior art FinFET device with various contact structures formed on the device.

FIG. 4R is a simplistic plan view of one embodiment of a FinFET device 100 disclosed herein that will be referenced to discuss certain advantages that may be achieved using the device disclosed herein. Due to the formation of the post-type source/drain contact structures 112 as disclosed herein, the distance 116 between the post-type source/drain contact structures 112 and the gate contact structure 114 may be greater than the distance 66 between the prior art line-type source/drain contact structures 64 and the gate contact structure 65 shown in FIG. 3. Accordingly, the chances of the gate contact structure 114 shorting with the source/drain contact structures 112 is reduced, and it enables a reduction in the distance 118 between the active area and the gate contact structure 114. For example, in one illustrative embodiment, the distance 118 between the metal silicide layer 110 and the gate contact structure 114 may be about 10-30 nm. Accordingly, using the methods and devices disclosed herein, the packing densities on integrated circuit products using such devices 100 may be reduced relative to corresponding prior art products, thereby desirably decreasing the "foot-print" of the device 100. In particular, note that, in the devices disclosed herein, the post-type source/drain contact structures 112 do not extend across the entire width of the active region 104 in the gate-width direction 119. Rather, the ends 112A of the post-type source/drain contact structures 112 stop well short of the edge 110A of the metal silicide layer 110. In one embodiment, the dimension 112D (length or diameter) of the post-type source/drain contact structures 112 may be about 10-80% of the overall width of the active region 104/metal silicide layer 110 in the gate width direction of the device 100. In the depicted example, a single post-type source/drain contact structure 112 is depicted as being formed to establish electrical contact to the source/drain regions. However, if desired, more than one of the post-type source/drain contact structures 112 may be formed on each of the source/drain regions. For example, FIG. 4S depicts an example wherein two of the post-type source/drain contact structures 112 are formed so as to contact the metal silicide layer 110 above each of the source/drain regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET transistor above an active region defined in a semiconductor substrate, comprising:

forming a plurality of fins in said semiconductor substrate;

forming a sacrificial gate structure above said plurality of fins, said sacrificial gate structure extending in a gate width direction oriented perpendicular with respect to an axial length direction of said plurality of fins;

forming a sidewall spacer adjacent said sacrificial gate structure;

performing an epitaxial deposition fin-merger process to form a plurality of merged-fin regions from portions of said plurality of fins that define a plurality of source/drain regions for said transistor;

removing said sacrificial gate structure to define a gate recess;

forming a conductive replacement gate structure in said gate recess;

forming a dielectric cap layer above said conductive replacement gate structure in said gate recess;

after forming said replacement gate structure, forming a metal silicide layer on an entire upper surface area of each of said plurality of source/drain regions;

forming a first sacrificial layer of material above said source/drain regions;

performing at least one etching process to define a patterned first sacrificial layer of material that comprises features that correspond to said at least one source/drain contact structure and to remove at least portions of said dielectric gate cap layer and at least a portion of said sidewall spacer so as to thereby expose a portion of said conductive replacement gate structure;

forming a layer of insulating material around said patterned first sacrificial layer of material and in contact with said exposed portion of said replacement gate structure;

with said replacement gate structure in position, removing remaining portions of said first sacrificial layer of material so as to defined a plurality of source/drain contact opening in said layer of insulating material exposing portions of said metal silicide layer; and forming at least one source/drain contact structure for each of said plurality of source/drain regions in said plurality of source/drain contact openings, wherein said at least one source/drain contact structure is formed such that it is conductively coupled to a portion of said metal silicide layer and a dimension of said at least one source/drain contact structure in said gate width direction is less than a dimension of said source/drain region in said gate width direction.

2. The method of claim 1, further comprising forming a gate contact structure that is conductively coupled to said replacement gate structure.

3. The method of claim 2, wherein said at least one source/drain contact structure and said gate contact structure are formed at the same time by performing a plurality of common process operations.

4. The method of claim 1, further comprising:
forming a second sacrificial material in said source/drain contact openings;
removing said second sacrificial material from within said source/drain contact openings so as to thereby expose said metal silicide layer; and
after removing said second sacrificial material, forming said at least one conductive structure in each of said source/drain contact openings such that it is conductively coupled to said metal silicide layer.

5. The method of claim 4, wherein, after forming said second sacrificial material in said source/drain contact openings but prior to removing said second sacrificial material from within said source/drain contact openings, the method further comprises:
masking said second sacrificial material;
with said second sacrificial material masked, forming a gate contact opening in said layer of insulating material to expose a portion of said replacement gate structure; and
after removing said second sacrificial material from within said source/drain contact openings, performing a plurality of common process operations to form said at least one source/drain contact structure in said source/drain contact openings and a gate contact structure in said gate contact opening at the same time.

6. The method of claim 4, wherein said first sacrificial layer of material is comprised of polysilicon or amorphous silicon and said second sacrificial material is comprised of OPL.

7. A method of forming a FinFET transistor above an active region defined in a semiconductor substrate, comprising:

forming a plurality of fins in said semiconductor substrate;

forming a sacrificial gate structure above said plurality of fins;

performing an epitaxial deposition fin-merger process to form a plurality of merged-fin regions from portions of said plurality of fins that define a plurality of source/drain regions for said transistor;

removing said sacrificial gate structure and forming a replacement gate structure in its place;

at some point after forming said replacement gate structure, forming a metal silicide layer on an entire upper surface area of each of said plurality of source/drain regions;

with said replacement gate structure in position, forming a first sacrificial layer of material above said source/drain regions;

patterning said first sacrificial layer of material to define features in said patterned first sacrificial layer of material;

forming a layer of insulating material around said patterned first sacrificial layer of material;

removing remaining portions of said first sacrificial layer of material so as to define a plurality of source/drain contact openings in said layer of insulating material;

forming a second sacrificial material in said source/drain contact openings;

masking said second sacrificial material;

with said second sacrificial material masked, forming a gate contact opening in said layer of insulating material to expose a portion of said replacement gate structure;

removing said second sacrificial material from within said source/drain contact openings so as to thereby expose said metal silicide layer; and after removing said second sacrificial material from within said source/drain contact openings, performing a plurality of common process operations to form at least one source/drain contact structure in said source/drain contact openings and a gate contact structure in said gate contact opening at the same time.

8. The method of claim 7, wherein said at least one source/drain contact structure is formed such that it is conductively coupled to a portion of said metal silicide layer and a dimension of said at least one source/drain contact structure in a gate width direction of said transistor is less than a dimension of said source/drain region in said gate width direction.

* * * * *

UNITED STATES PATENT AND TRADEMARK OFFICE
CERTIFICATE OF CORRECTION

PATENT NO. : 9,515,163 B2
APPLICATION NO. : 14/021594
DATED : December 6, 2016
INVENTOR(S) : Ruilong Xie et al.

Page 1 of 1

It is certified that error appears in the above-identified patent and that said Letters Patent is hereby corrected as shown below:

In the Claims

Column 17, Line 37, delete "defined" and insert therefor -- define --.

Column 17, Line 38, delete "opening" and insert therefor -- openings --.

Signed and Sealed this
Seventh Day of February, 2017

Michelle K. Lee
*Director of the United States Patent and Trademark Office*